US009841870B2

(12) United States Patent
Hadley et al.

(10) Patent No.: US 9,841,870 B2
(45) Date of Patent: Dec. 12, 2017

(54) INTEGRATED VISUALIZATION AND ANALYSIS OF A COMPLEX SYSTEM

(71) Applicant: The Boeing Company, Huntington Beach, CA (US)

(72) Inventors: Brent L. Hadley, Kent, WA (US); Patrick J. Eames, Newcastle, WA (US); Joseph F. Floyd, University Place, WA (US)

(73) Assignee: THE BOEING COMPANY, Chicago, IL (US)

( * ) Notice: Subject to any disclaimer, the term of this patent is extended or adjusted under 35 U.S.C. 154(b) by 647 days.

(21) Appl. No.: 14/464,904

(22) Filed: Aug. 21, 2014

(65) Prior Publication Data

US 2016/0054889 A1     Feb. 25, 2016

(51) Int. Cl.
*G06F 3/048* (2013.01)
*G06F 3/0481* (2013.01)
(Continued)

(52) U.S. Cl.
CPC ........ *G06F 3/04815* (2013.01); *G06F 3/0482* (2013.01); *G06F 17/50* (2013.01); *G06T 19/003* (2013.01); *G06T 2200/24* (2013.01)

(58) Field of Classification Search
CPC .... G06F 3/04815; G06F 3/0482; G06F 17/50; G06T 19/003
(Continued)

(56) References Cited

U.S. PATENT DOCUMENTS 5,341,466 A     8/1994  Perlin et al.
RE36,145 E      3/1999  DeAguiar et al.
(Continued)

FOREIGN PATENT DOCUMENTS

EP     1 176 520 A2    1/2002
EP     1 503 301 A2    2/2005
(Continued)

OTHER PUBLICATIONS

"About Deep Zoom Composer," Microsoft, Copyright 2011 [retrieved on Nov. 23, 2011] Retrieved using Internet <URL: http://msdn.microsoft.com/en-us/library/dd409068(d=printer). aspx; 4 pages.
(Continued)

*Primary Examiner* — David Phantana Angkool
(74) *Attorney, Agent, or Firm* — Womble Carlyle Sandridge & Rice LLP

(57) ABSTRACT

An apparatus is provided for implementation of a system for integrated visualization and analysis of a complex system such as an aircraft composed of a plurality of elements. The apparatus may receive data for a physical instance of the complex system, and this data may include a list of the plurality of elements that reflects a relationship between at least some of them. The apparatus may generate a visual presentation of a digital three-dimensional (3D) model of the complex system. The apparatus may generate a layout of document components depicting elements of the plurality of elements, with the layout including one or more two-dimensional (2D) images depicting at least some of the elements. And the apparatus may integrate the data, visual presentation of the 3D model and layout to produce a visual definition of the complex system.

24 Claims, 16 Drawing Sheets

(51) Int. Cl.
*G06F 3/0482* (2013.01)
*G06F 17/50* (2006.01)
*G06T 19/00* (2011.01)

(58) Field of Classification Search
USPC .................................................. 715/859
See application file for complete search history.

(56) References Cited

U.S. PATENT DOCUMENTS

| | | |
|---|---|---|
| 6,650,998 B1 | 11/2003 | Rutledge et al. |
| 6,684,087 B1 | 1/2004 | Yu et al. |
| 6,704,024 B2 | 3/2004 | Robotham et al. |
| 6,766,331 B2 | 7/2004 | Shema et al. |
| 7,200,271 B2 | 4/2007 | Boose et al. |
| 7,246,328 B2 | 7/2007 | Boose et al. |
| 7,365,747 B2 | 4/2008 | Finlayson et al. |
| 7,783,644 B1 | 8/2010 | Petrou et al. |
| 7,802,204 B2 | 9/2010 | Merry et al. |
| 7,870,224 B1 | 1/2011 | Maigatter |
| 7,872,650 B2 | 1/2011 | Fay |
| 7,921,452 B2 | 4/2011 | Ridlon et al. |
| 8,051,031 B2 | 11/2011 | Sims, III et al. |
| 9,524,342 B2 * | 12/2016 | Hadley ............. G06F 17/30864 |
| 2003/0055871 A1 | 3/2003 | Roses |
| 2003/0100964 A1 | 5/2003 | Kluge et al. |
| 2004/0003097 A1 | 1/2004 | Willis et al. |
| 2004/0028294 A1 | 2/2004 | Fukuda |
| 2004/0093564 A1 | 5/2004 | Kumhyr et al. |
| 2004/0223648 A1 | 11/2004 | Hoene et al. |
| 2004/0267701 A1 | 12/2004 | Horvitz et al. |
| 2006/0161863 A1 | 7/2006 | Gallo |
| 2007/0094615 A1 | 4/2007 | Endo et al. |
| 2007/0226605 A1 | 9/2007 | Thomas |
| 2008/0004764 A1* | 1/2008 | Chinnadurai ...... G05B 23/0235 701/31.4 |
| 2008/0074423 A1 | 3/2008 | Gan et al. |
| 2008/0111813 A1 | 5/2008 | Gatzke et al. |
| 2008/0247636 A1* | 10/2008 | Davis ..................... G06T 19/00 382/152 |
| 2009/0086014 A1 | 4/2009 | Lea et al. |
| 2009/0086199 A1 | 4/2009 | Troy et al. |
| 2009/0112820 A1 | 4/2009 | Kessel et al. |
| 2009/0138139 A1* | 5/2009 | Tsai ..................... G06Q 30/0601 701/3 |
| 2009/0228838 A1* | 9/2009 | Ryan ..................... G09G 5/14 715/853 |
| 2009/0317020 A1 | 12/2009 | Gerhard et al. |
| 2010/0042361 A1* | 2/2010 | Hadley ................ G01C 21/165 702/152 |
| 2010/0102980 A1 | 4/2010 | Troy et al. |
| 2010/0217566 A1* | 8/2010 | Wayne ..................... G06F 17/50 703/1 |
| 2010/0223269 A1 | 9/2010 | Shuf et al. |
| 2010/0229115 A1 | 9/2010 | Augustine et al. |
| 2010/0306696 A1 | 12/2010 | Groth et al. |
| 2011/0087463 A1* | 4/2011 | Nakhle ............... G06F 17/5095 703/1 |
| 2011/0087513 A1 | 4/2011 | Floyd et al. |
| 2011/0137713 A1* | 6/2011 | Dalgas ............... H05K 7/20836 705/7.39 |
| 2011/0149266 A1 | 6/2011 | Motzer et al. |
| 2011/0202859 A1* | 8/2011 | Fong ..................... G06F 3/04883 715/769 |
| 2011/0235858 A1* | 9/2011 | Hanson ............... G06F 17/3028 382/103 |
| 2012/0188248 A1* | 7/2012 | Eames ................. H04N 1/3872 345/428 |
| 2012/0221625 A1 | 8/2012 | Troy et al. |
| 2012/0233037 A1* | 9/2012 | Lamoureux ............ G06Q 30/02 705/27.2 |
| 2014/0215317 A1* | 7/2014 | Floyd .................... G06F 17/211 715/243 |
| 2014/0215318 A1* | 7/2014 | Floyd ................ G06F 17/30011 715/243 |
| 2017/0178043 A1* | 6/2017 | Wayne ............. G06Q 10/06313 |

FOREIGN PATENT DOCUMENTS

| | | |
|---|---|---|
| EP | 1 860 573 A1 | 11/2007 |
| EP | 2 482 538 A1 | 8/2012 |
| EP | 2608080 A1 | 6/2013 |
| EP | 2 642 414 A2 | 9/2013 |
| EP | 2759947 A1 | 7/2014 |
| WO | WO 2009005949 A1 | 1/2009 |

OTHER PUBLICATIONS

Airframe & Powerplant Mechanics General Handbook, US Department of Transportation Federal Aviation Administration, Chapter 2, Mar. 31, 1999; pp. 35-52.
Cohn, "Back to Flat—Producing 2D Output from 3D Models," Autodesk University 2009, Dec. 11, 2009, pp. 1-14.
"Data differencing," 2012, Wikipedia, the Free Encyclopedia, [retrieved on Jul. 9, 2012] Retrieved using Internet <URL: http://en.wikipedia.org/w/index.php?title=Data_differencing&printable=yes, 3 pages.
"Deep Zoom," Mar. 2008, Wikipedia, the Free Encyclopedia, [retrieved on Apr. 18, 2012] Retrieved using Internet <URL: http://en.wikipedia.org/wiki/DeepZoom; 4 pages.
European Search Report dated May 25, 2012 for European Application No. 12 152 591.9, 13 pages.
European Search Report dated Mar. 6, 2013 for European Application No. 12 198 374.6, 7 pages.
European Search Report dated Mar. 12, 2013 for European Application No. 12 198 679.8, 8 pages.
European Search Report dated Mar. 19, 2013 for European Application No. 12 195 735.1, 7 pages.
European Search Report dated Aug. 7, 2013 for European Application No. 13 160 361.5; 6 pages.
European Search Report dated Sep. 2, 2013 for European Application No. 13 160 848.1; 6 pages.
European Search Report dated Dec. 12, 2013 for European Application No. 13 184 084.5, 6 pages.
European Search Report dated Feb. 10, 2014 for European Application No. 13 194 943.0, 6 pages.
European Search Report dated Apr. 4, 2014 for European Application No. 14 152 644.2, 8 pages.
European Search Report dated Apr. 4, 2014 for European Application No. 14 152 646.7, 9 pages.
Fitzpatrick et al., "Analytical Method for the Prediction of Reliability and Maintainability Based Life-Cycle Labor Costs," Journal of Mechanical Design, vol. 121, Issue 4, 1999, 24 pages.
"Futuristic software from Minority Report is real," published Jul. 23, 2012, [retrieved on Aug. 30, 2012] Retrieved using Internet <URL: http://www.foxnews.com/tech/2012/07/23/futuristic-software-from-minority-report-is-real/; 3 pages.
"Hard Rock Memorabilia," Copyright 2009, Hard Rock Cafe International, Inc., [retrieved on Apr. 18, 2012] Retrieved using Internet <URL: http://memorabilia.hardrock.com, 2 pages.
Hunter, "Theodolite, Documentation/Help/FAQ," Apr. 24, 2012, Hunter Research and Technology LLC [retrieved on Dec. 14, 2012] Retrieved using Internet <URL: http://hunter.pairsite.com/mobile/theodolite/help/, 6 pages.
International Search Report dated Dec. 21, 2012 for PCT/US2012/054808, 4 pages.
International Search Report dated Jan. 18, 2013 for PCT/US2012/058937, 4 pages.
Li et al., "Automated Generation of Interactive 3D Exploded View Diagrams," ACM Transactions on Graphics, vol. 27, No. 3, Aug. 1, 2008, 7 pages.
Petre et al., "3D Model-based Semantic Labeling of 2D Objects," 2011 International Conference on Digital Image Computing: Techniques and Applications (DICTA), IEEE, Dec. 6, 2011, pp. 152-157.

(56) References Cited

OTHER PUBLICATIONS

Quintana et al., "Will Model-based Definition replace engineering drawings throughout the product lifecycle? A global perspective from aerospace industry," copyright 2010, Computers in Industry, vol. 61, pp. 497-508.
Rao et al., "Rich Interaction in the Digital Library," Communications of the ACM, Association for Computing Machinery, Inc., United States, vol. 38, No. 4, Apr. 1995, pp. 29-39.
"Reliability and Maintainability Definitions," System Reliability Center, Rome, NY; IIT Research Institute, 2001, 2 pages.
Tatzgern et al., "Multi-perspective Compact Explosion Diagrams," Computers & Graphics, vol. 35, No. 1, Feb. 1, 2011, pp. 135-147.
Written Opinion dated Dec. 21, 2012 for PCT/US2012/054808, 6 pages.
Written Opinion dated Jan. 18, 2013 for PCT/US2012/058937, 9 pages.
International Search Report dated Jun. 8, 2016 for Application No. 15181710.3.

\* cited by examiner

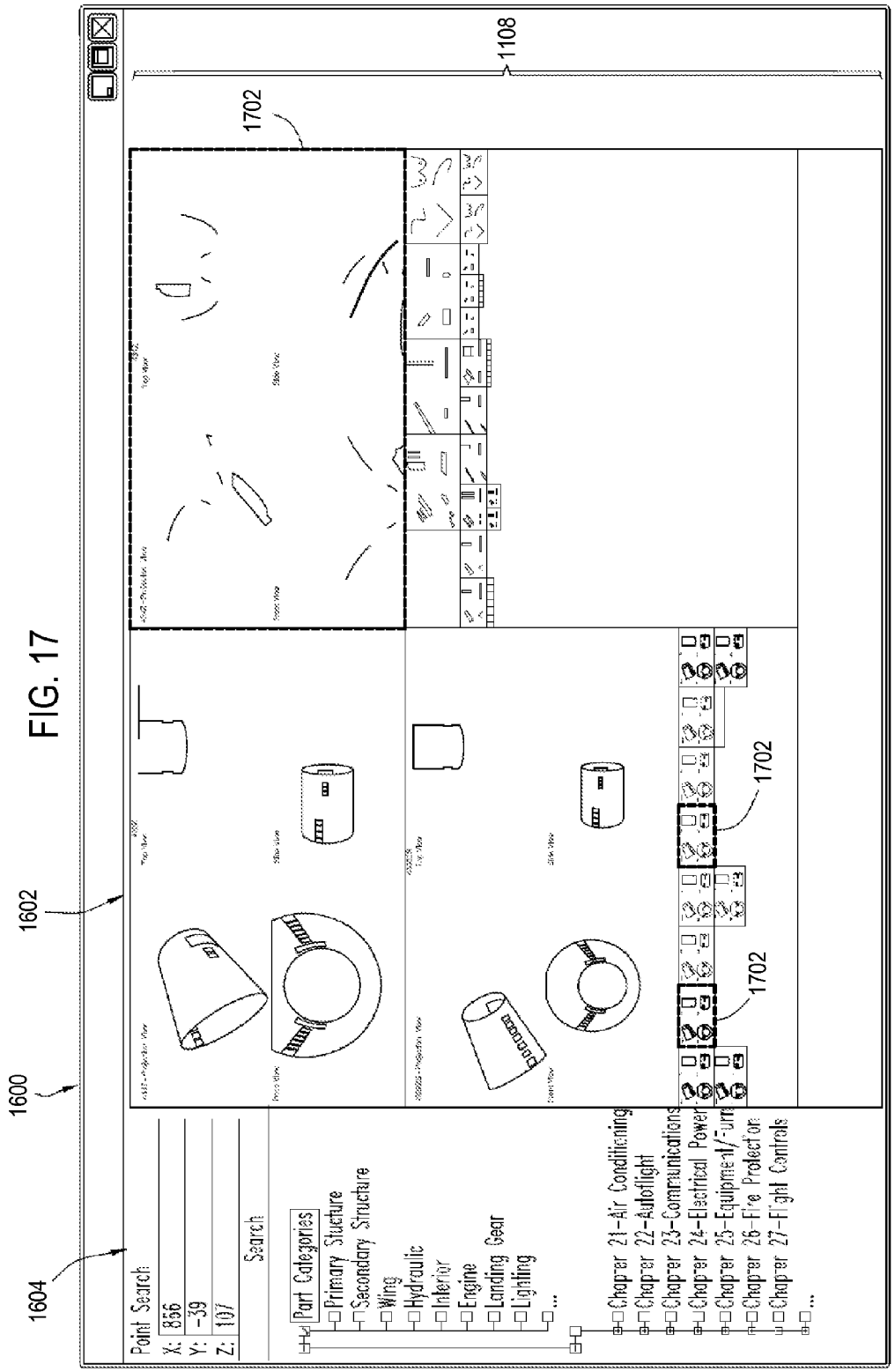

INTEGRATED VISUALIZATION AND ANALYSIS OF A COMPLEX SYSTEM

CROSS-REFERENCE TO RELATED APPLICATION(S)

The present application is related to U.S. patent application Ser. No. 13/751,937, entitled: Panoptic Visualization of Elements of a Complex System using a Model Viewer, U.S. patent application Ser. No. 13/751,994, entitled: Panoptic Visualization of Elements of a Complex System using Localization of a Point on a Physical Instance of the Complex System, and U.S. patent application Ser. No. 13/752,060, entitled: Panoptic Visualization of a Three-Dimensional Representation of a Complex System, all of which filed on Jan. 28, 2013. The present application is also related to U.S. patent application Ser. No. 13/414,987, entitled: Panoptic Visualization Document Layout, U.S. patent application Ser. No. 13/414,964, entitled: Panoptic Visualization Document Navigation, and U.S. patent application Ser. No. 13/414,940, entitled: Panoptic Visualization Document Collection, all of which filed on Mar. 8, 2012; and which claim priority to respective ones of U.S. Provisional Patent Application No. 61/578,349, entitled: Panoptic Visualization Document Layout, U.S. Provisional Patent Application No. 61/578,357, entitled: Panoptic Visualization Document Navigation, and U.S. Provisional Patent Application No. 61/578,361, entitled: Panoptic Visualization Document Collection, all of which filed on Dec. 21, 2011. And the present application is related to U.S. patent application Ser. No. 13/072,217, entitled: Image Management and Presentation, filed on Mar. 25, 2011, which claims priority to U.S. Provisional Patent Application No. 61/436,585, entitled: Navigation to Aircraft Maintenance Information Using Tiled 2D Illustrations, filed on Jan. 26, 2011. The contents of all of the aforementioned are incorporated herein by reference in their entireties.

TECHNOLOGICAL FIELD

The present disclosure relates generally to analysis of a complex system and, in particular, to analysis of a complex system through integrated visualization of data for a physical instance of the complex system, and a digital three-dimensional (3D) model and layout of document components depicting elements of the complex system.

BACKGROUND

Many complex systems such as large transport aircraft are composed of multiple systems and each system may contain several hundred thousand parts. In the case of aircraft, these various systems are frequently analyzed by stakeholders such as airlines, original equipment manufacturers (OEMs), part suppliers and other parties for a number of different reasons. For example, these stakeholders may analyze systems in order to troubleshoot problems that may be occurring on a specific part on a specific aircraft. In another example, stakeholders may analyze systems to spot trends of problems occurring on specific parts on fleets of similar aircraft. And in another example, stakeholders may analyze systems to recognize issues/problems that may be related to multiple parts on multiple systems on multiple aircraft on multiple fleets of aircraft.

Various systems and methods currently exist for analyzing specific types of problems or trends to specific aircraft systems. But these current systems and methods do not allow the user to integrate information from multiple information systems related to multiple aircraft systems, and to simultaneously display the information in an easily-interpretable manner. Therefore, it may be desirable to have an apparatus and method that takes into account at least some of the issues discussed above, as well as possibly other issues.

BRIEF SUMMARY

Example implementations of the present disclosure are generally directed to an apparatus for implementation of a system for integrated visualization and analysis of a complex system such as an aircraft composed of a plurality of elements, and corresponding method and computer-readable storage medium. Example implementations may integrate data for a physical instance of the complex system, visual presentation of a three-dimensional (3D) model of the complex system, and layout including one or more two-dimensional (2D) images depicting at least some of the elements. In some but not all examples, the layout may include panoptically-arranged document components at least some of which include 2D images depicting at least some of the elements. And through this integration, example implementations may produce a visual definition of the complex system for visualization and analysis. In the context of aircraft (and similarly other complex systems), the data may reflect an as-manufactured configuration of the aircraft. The 3D model and layout of document components including 2D images, then, may reflect engineering design data for the aircraft. The visual definition produced by example implementations may then at times provide a complete manufacturing and engineering definition of the aircraft.

The visual definition produced according to example implementations may be beneficial in a number of different contexts, such as in instances in which the complex system has been designed using a hybrid-technique or a combination of both 3D design tools and legacy 2D design tools. This may be the case, for example, for large transport aircraft composed of multiple systems each of which may contain several hundred thousand parts. In some examples, design of a complex system such as these large transport aircraft may result in some of its systems or parts being depicted by the 3D model but not any of the 2D images, or being depicted by at least some of the 2D images but not the 3D model. Example implementations may allow an end user to visualize the elements of a complex system and relationships between the elements in both the 3D context of the complex system and in 2D so that they may be easily understood and quickly analyzed.

According to one aspect of example implementations, the apparatus includes a processor and a memory storing executable instructions that in response to execution by the processor cause the apparatus to at least perform a number of functions or operations. In accordance with this aspect, the apparatus may be caused to receive data for a physical instance of the complex system, and this data may include a list of the plurality of elements that reflects a relationship between at least some of the plurality of elements.

The apparatus may be caused to generate a visual presentation of a digital three-dimensional (3D) model of the complex system, with the visual presentation depicting elements of the plurality of elements. The apparatus may likewise be caused to generate a layout of document components depicting elements of the plurality of elements, with the layout including one or more two-dimensional (2D)

images depicting at least some of the elements. In some examples, the layout may include panoptically-arranged document components at least some of which include 2D images depicting at least some of the elements. The apparatus may be caused to integrate the data, visual presentation of the 3D model and layout of document components to produce a visual definition of the complex system; and at least the visual presentation and layout in the visual definition may be navigable through interaction with the data.

In some examples, the visual presentation of the 3D model may depict one or more elements absent from the document components of the layout. And in some examples, the document components of the layout may depict one or more elements absent from the visual presentation of the 3D model.

In some examples, the memory stores further executable instructions that in response to execution by the processor cause the apparatus to further navigate the visual presentation of the 3D model or layout of document components. This navigation may include the apparatus being caused to at least receive selection of an element from the list of the plurality of elements, and manipulate the visual presentation of the 3D model or layout of document components in the visual definition to draw attention to the element therein. Here, the manipulation may include the apparatus being caused to focus on a portion of the visual presentation including the element or apply a visual effect to the element, and/or focus on or apply a visual effect to one or more document components of the layout that depict the element.

In some examples, the memory stores further executable instructions that in response to execution by the processor cause the apparatus to further receive additional data for elements of the plurality of elements. In these examples, the apparatus being caused to integrate the data, visual presentation of the 3D model and layout of document components may further include the additional data. The additional data in the visual definition, then, may be navigable through interaction with the data, visual presentation or layout.

In some further examples, the memory stores further executable instructions that in response to execution by the processor cause the apparatus to further navigate the additional data. This navigation may include the apparatus being caused to at least receive selection of an element of the plurality of elements. The element may be selectable from each of the list of the plurality of elements, visual presentation of the 3D model and layout of document components. And then the apparatus may be caused to manipulate the additional data in the visual definition to draw attention to additional data for the element.

In some examples, the memory stores further executable instructions that in response to execution by the processor cause the apparatus to further at least receive and process additional data for the physical instance of the complex system. The additional data may be received and processed to identify a topical element from the plurality of elements, with the elements depicted by the visual presentation of the 3D model including the topical element and one or more other elements of the plurality of elements. The apparatus in these examples may also be caused to apply a visual effect to the topical element depicted by the visual presentation to distinguish the topical element from the one or more other elements depicted by the visual presentation.

In some examples, the memory stores further executable instructions that in response to execution by the processor cause the apparatus to further at least receive user-selection of a particular point on the visual presentation of the 3D model in the visual definition of the complex system, and translate the particular point to a particular location within a coordinate system of the complex system. In these examples, the apparatus being caused to generate the layout of document components may include being caused to at least identify a first document component that depicts an element of the complex system at the particular location or within a volume about or at least in part defined by the particular location. The first document component may have and be identified from associated metadata that provides structured information reflecting a 3D geometry of the element within the coordinate system of the complex system. And the apparatus may be caused to generate the layout of document components including the first document component, and including one or more second document components identified from the associated metadata that provides structured information further identifying a link between the first document component and one or more second document components.

In other aspects of example implementations, a method and computer-readable storage medium are provided for integrated visualization and analysis of a complex system. The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

Figure 9:
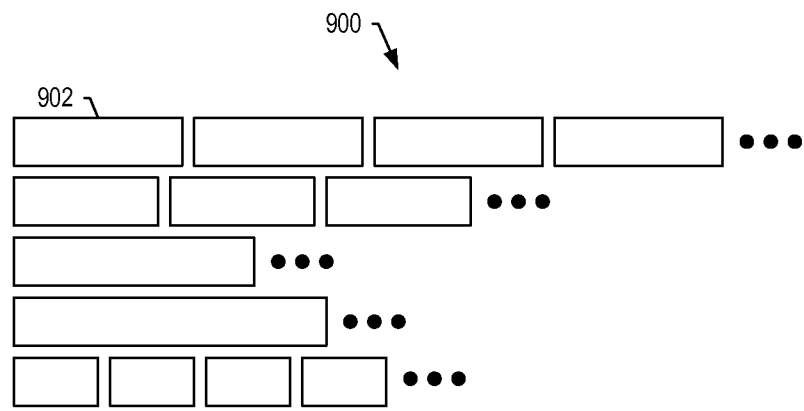
Figure 10:
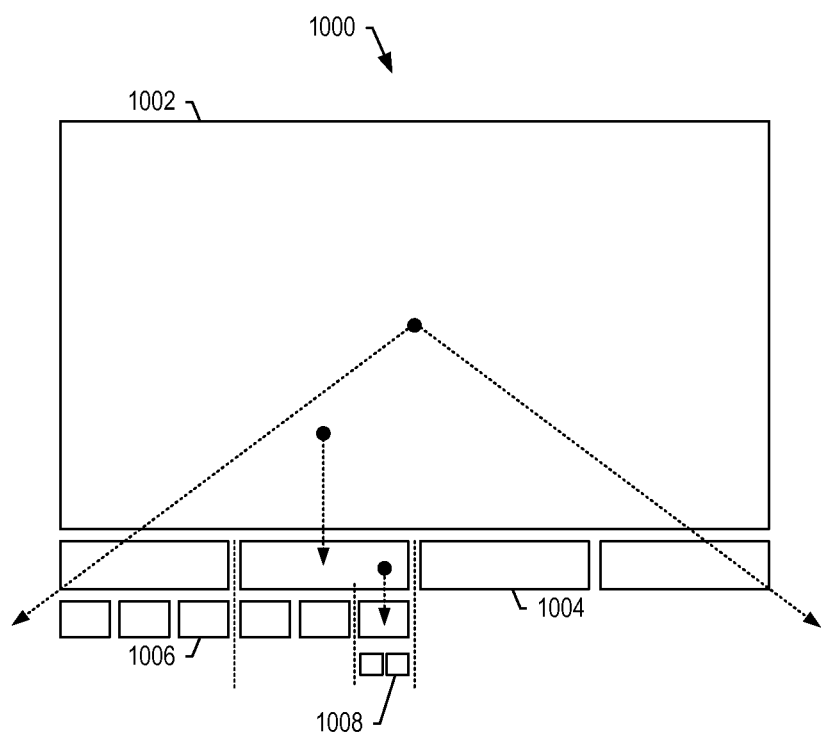

FIGS. 9 and 10 schematically illustrate examples of suitable layout models according to example implementations; and FIGS. 11-17 depict example layouts of pages that may be displayed in a GUI that has a predetermined viewable area, and which may be navigated by a user, according to example implementations of the present disclosure.

DETAILED DESCRIPTION

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure relate generally to visualization and analysis of a complex system. More particularly, various example implementations relate to analysis of a complex system through visualization of a visual definition of the complex system produced by integration of data for a physical instance, and 3D model and layout of pages including those with 2D images that depict elements of the complex system. Example implementations will be primarily described in conjunction with aerospace applications. It should be understood, however, that example implementations may be utilized in conjunction with a variety of other applications, both in the aerospace industry and outside of the aerospace industry. Furthermore, it should be understood that unless otherwise specified, the terms "data," "content," "information," and similar terms may be at times used interchangeably.

Figure 1:
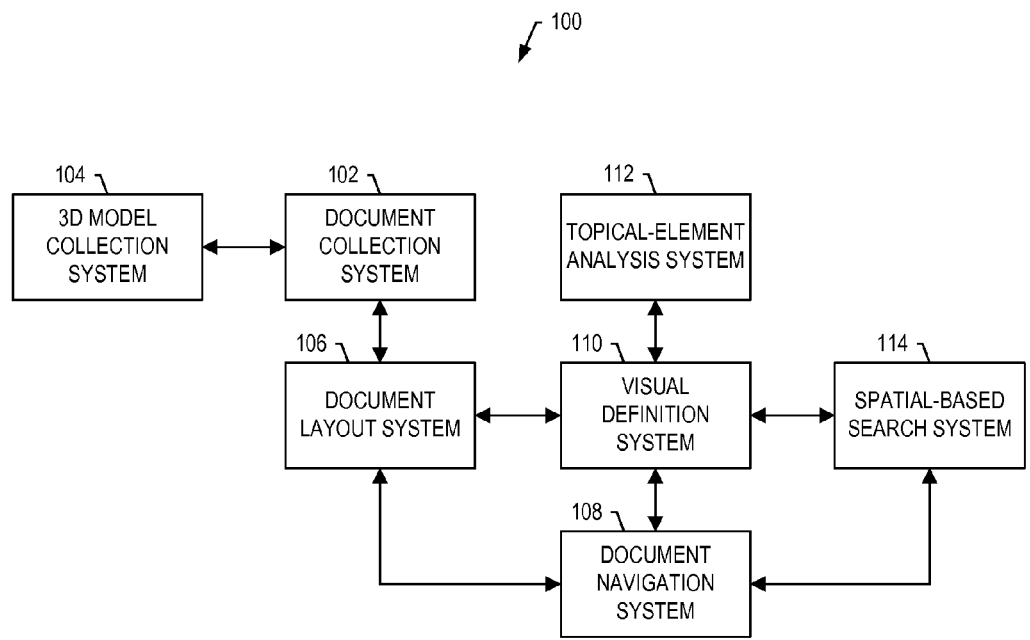
FIG. 1 is an illustration of an integrated visualization and analysis system in accordance with an example implementation.

Referring now to FIG. 1, an integrated visualization and analysis system 100 is illustrated according to example implementations of the present disclosure. The system may include any of a number of different subsystems (each an individual system) for performing one or more functions or operations with respect to one or more electronic documents, at least some of which may be two-dimensional (2D) derivatives of a digital three-dimensional (3D) model of a complex system. As shown, for example, the system may include a document collection system 102, 3D model collection system 104, document layout system 106, document navigation system 108, visual definition system 110, topical-element analysis system 112 and/or spatial-based search system 114.

Although being shown as part of the integrated visualization and analysis system 100, one or more of the document collection system 102, 3D model collection system 104, document layout system 106, navigation system 108, visual definition system 110, topical-element analysis system 112 and/or spatial-based search system 114 may instead be separate from but in communication with the integrated visualization and analysis system. In some examples, one or more of the subsystems may form a panoptic visualization system such as that described by any one or more of the patent applications cited and incorporated above in the Cross-Reference to Related Application(s) section. It should also be understood that one or more of the subsystems may function or operate as a separate system without regard to others of the subsystems. And further, it should be understood that the integrated visualization and analysis system may include one or more additional or alternative subsystems than those shown in FIG. 1.

As described herein, an electronic document (or simply document) may be any electronic media content capable of being visualized in an electronic and/or printed (or printable) form. The media content of a document may include one or more of textual, graphical or other visual content such as still images, video or the like. The document may be of a number of different types of documents in which the type of document may be defined by one or more characteristics of the document such as its format, media content or the like. Examples of suitable types of documents include computer-aided design documents (e.g., CAD, CATDrawing, CATPart, CATProduct, CATProcess, cgr, DWG, DXF, DWF, etc.), text-based documents (e.g., ANS, ASC, DOC, DOCX, HTML, PDF, RTF, TXT, WPD, etc.), presentation documents (e.g., PDP, PPT, etc.), graphics documents (e.g., BMP, GIF, JPEG, JP2, PNG, PSD, PSP, RAW, TIFF, etc.), video documents (e.g., AVI, MPEG, QuickTime, WMV, etc.) or the like. Other examples of suitable types of documents include single or collections of medical documents (e.g., medical reports, medical imaging documents, etc.), financial documents, legal documents (e.g., court decisions, briefs, patents, etc.), art/architecture documents (e.g., paintings, blueprints, etc.) books, manuals, magazines or trade publications, articles, web pages, screenshots, service bulletins, engineering diagrams, warranties, technical drawings, wiring diagrams, sensor documents or the like. And still further examples of suitable types of documents include data sets such as engineering design data, wiring data, troubleshooting data, business data or the like.

A document may be composed of one or more constituent document components that may be groupings of its media content such as between basic breaking points. The document components may depend on the type of document and may include, for example, electronic pages, slides, diagrams, drawings, still images, videos or the like. The document component may at times be generally referred to as a "page," although the document component need not necessarily be an electronic page as it may include other types of components. In instances in which a document includes only one component, the document and its component may be one and the same.

As described herein, reference may be made to a document composed of constituent pages. It should be understood, however, that example implementations may be equally applicable to a group (collection) of documents composed of constituent documents, which may or may not be further composed of constituent pages. Thus, functions performed with respect to a document may be equally performed with respect to a group of documents, and functions performed with respect to a page may be equally performed with respect to a constituent document.

Each page may be formed of data from which a visual representation such as an image of it (or rather its media content) may be generated in an electronic and/or printed (or printable) form. The visual representation of a page may at times be generally referred to as simply the page or as an "image," although the page need not necessarily include a still image as it may include other types of media content.

A page may include media content that has one or more subjects and includes one or more objects reflecting or otherwise forming the subject(s). At times, a page may therefore be said to depict its subject(s) and/or object(s) of its subject(s). As an example, a page may have an aircraft as its subject and include an exterior or interior view or sections of the exterior/interior view of the aircraft as object(s), or the page may have the exterior/interior view as its subject and include the sections of the exterior view as objects. As another example, a page may have an aircraft instrument panel as its subject and include gauges of the instrument panel as subjects.

In various examples, one or more documents may be for a complex system such as an aircraft or any of a number of other structures including physical structures, biological structures, chemical structures or the like. As suggested above, these "system-related" documents and their system-related pages may include, for example, engineering diagrams, technical drawings, wiring diagrams or the like. These documents may also include maintenance documents and/or operations documents (either generally referred to as a "maintenance document"). A complex system may be generally composed of one or more components, subsystems or the like (each generally referred to as a "subsystem"), with each subsystem being composed of one or more parts, and each part including one or more features. In this regard, the parts of the complex system may be assembled into a number of subsystems, which in turn may be assembled into the complex system. In the context of an aircraft, one or more parts or subsystems may be designed as a modular component of the aircraft often referred to as a line-replaceable unit (LRU), of which a single aircraft may include a number of LRUs and other parts or subsystems. Any of the complex system itself or any of its subsystems, parts (of subsystems), features (of parts) or the like may at times be generally referred to as an "element" of the complex system.

Generally, a system-related document may include any of a number of documents that visually depict (e.g., graphically or textually) one or more elements of a complex system. In some examples, this depiction may include one or more maintenance or operations tasks on or using such element(s) (either generally referred to as a "maintenance task") such as for operation, installation, maintenance, repair, removal, replacement or testing of element(s) of the complex system.

Examples of suitable aircraft maintenance documents include an aircraft illustrated parts catalog (AIPC), aircraft flight manual (AFM), aircraft maintenance manual (AMM), aircraft recovery manual (ARM), airworthiness directive (AD), component maintenance manual (CMM), component maintenance manual parts list (CMMIPL), configuration change support data (CCSD), configuration deviation list (CDL), consumable products manual (CPM), engine (shop) manual (EM), engineering drawings (ED), equipment list (EL), dispatch deviation guide (DDG), engine cleaning inspection and repair manual (CIR), engine illustrated parts catalog (EIPC), engine parts configuration management section (EPCM), fault repair manual (FRM), fault reporting and fault isolation manual (FRM/FIM), flight crew operations manual (FCOM), general maintenance manual (GMM), illustrated tool and equipment manual (ITEM), in-service activity report (ISAR), maintenance planning document (MPD), maintenance review board report (MRB), maintenance synoptics, maintenance tips (MT), maintenance training manual (MTM), master minimum equipment list (MMEL), non-destructive testing manual (NDT), power plant build-up manual (PPBM), power plant build-up manual illustrated parts list (PPBMIPL), production management database (PMDB), repair record, service bulletin (SB), service bulletin index (SBI), service letter (SL), structural repair manual (SRM), systems description section (SDS), system schematics manual (SSM), tool and equipment manual (TEM), weight and balance manual (WBM), wiring diagram manual (WDM) or the like.

A system-related document may be composed of one or more pages including media content, which again may include textual, graphical (e.g., drawings) or other visual content. In one example, the media content may include drawings and/or textual lists depicting one or more elements of a complex system. In various examples, the media content may also include other information regarding the element(s).

For example, a page may include a drawing and/or textual list (media content) of a complex system (subject) including multiple subsystems (objects), a subsystem (subject) including multiple parts (objects), or a part (subject) including one or more features (objects). Additionally or alternatively, for example, a page may include a drawing and/or textual instructions (media content) of a maintenance task (subject) including multiple subtasks (objects), a subtask (subject) including multiple maintenance actions (objects), or a maintenance action (subject/object).

Drawings may graphically depict elements in various views with various levels of detail. The drawings may include detail drawings, assembly drawings and/or installation drawings. For example, a detail drawing may depict a part, and an assembly drawing may depict the complex system or one or more of its subsystems. An assembly drawing may reflect any of a number of different relationships between or among the complex system, its subsystems or parts of its subsystems. For example, an assembly drawing may reflect a relationship between subsystems of a complex system, or a relationship between parts of a subsystem. In one example, one or more assembly drawings are accompanied by one or more detailed drawings of one or more parts it depicts. An illustration drawing may depict an element in its final position on the complex system.

The drawings may depict elements in any of a number of different manners, such as by pictorial drawings, diagrams and/or orthographic projections. A pictorial drawing may depict an element as it appears to the eye (similar to a photograph). A diagram may depict the complex system or one or more of its subsystems, and may indicate their subsystems or parts and express methods or principles of manufacture, operation or the like (e.g., illustration diagram). A diagram may be of any of a number of different types, such as an engineering diagram or other technical drawing, wiring diagram, schematic diagram, installation diagram or the like.

Orthographic projection drawings may depict an element in a number of views, which may depict the element from one or more angles and/or levels of detail. For example, an element may be depicted in one or more of projection, front, top, bottom, rear, right-side and/or left-side views. Also, for example, a view of an element may be a complete view, a detail view or sectional view. A complete view may be considered a principal view of an element, and may depict the element at any angle. A detail view may only depict a portion of an element but do so in greater detail and to a larger scale than the principle view, and a sectional view may depict a portion of an element with the rest of the element being cut away at a cutting plane. In one example, the portion of an element depicted in a detail view may be encircled on a related complete view; and similarly, in one example, the portion of the element depicted in a sectional view may be indicated by the cutting plane line on the related complete view.

In addition to or in lieu of drawing(s), each of one or more pages of a system-related document may textually depict elements of the complex system. In one example, one or more pages may include one or more textual instructions (media content) for executing a maintenance task performed on or using elements of the complex system. In another example, one or more pages may include a textual list (media content) of information for the complex system and/or one or more of its elements. A list may include any of a number of different types of information regarding the complex system/elements including, for example, a name, number (e.g., system number, part number) or other identifier of the complex system/element, a required quantity of the element, the source of the complex system/element (e.g., manufacturer, distributor, etc.), the position of the element, related complex system/element identifiers or the like. The list may also include one or more references that identify the element in drawing(s) of the system-related document, and/or one or more references that identify drawing(s) depicting the element (partially or completely).

Generally, documents and/or their pages according to example implementations may have one or more logical relationships between one another. In the context of a system-related document, for example, pages sharing a common system-related document may be logically related, or pages adjacent one another in order sequence in a common system-related document may be logically related. In other examples, the pages may be logically related according to one or more relationships between elements of the complex system depicted therein. These relationships may include, for example, spatial relationships, design relationships (e.g., work breakdown structure (WBS), system function, design family), functional relationships or the like.

For example, pages depicting the same element (partially or completely) may be logically related according to the spatial, design or functional relationship of depicting the same element. A page depicting the complex system may be logically related to pages depicting the complex system's subsystems, parts or features, according to spatial, design or functional relationships between the respective elements. In another example, a page depicting a subsystem may be logically related to pages depicting the subsystem's parts or features, according to spatial, design or functional relationships between the respective elements. And in yet another example, a page depicting a part may be logically related to pages depicting the part's features, according to spatial, design or functional relationships between the respective part and features.

In another example, a page depicting an element (partially or completely) may be logically related to a page depicting a maintenance task (partially or completely) performed on or using the respective element. Likewise, a page depicting a maintenance task (partially or completely) performed on or using an element may be logically related to a page depicting the respective element (partially or completely).

In yet another example, pages depicting the same maintenance task (partially or completely) may be logically related to one another. Pages depicting subtasks of the same maintenance task may be logically related to one another. Similarly, pages depicting actions of the same subtask may be logically related to one another. A page depicting a maintenance task may be logically related to pages depicting the task's subtasks or actions. And a page depicting a subtask may be logically related to pages depicting the subtask's actions.

In one example, logical relationship(s) between pages may be reflected in the graphical (e.g., drawings) and/or textual (e.g., lists, instructions) depictions themselves. One or more drawings and/or lists depicting one or more elements may include reference(s) such as number(s), letter(s), symbol(s) or the like to identify the respective element(s), or identify other drawing(s) depicting the respective element(s) (partially or completely). Drawing(s) and/or instruction(s) depicting maintenance task(s) may include reference(s) such as number(s), letter(s), symbol(s) or the like to identify the respective maintenance task(s), or identify other maintenance task(s) depicting the respective maintenance task(s).

Further, drawing(s) and/or instruction(s) depicting maintenance task(s) performed on or using element(s) may include reference(s) such as number(s), letter(s), symbol(s) or the like to identify the respective element(s), or identify drawing(s) depicting the respective element(s) (partially or completely). In the case of a reference identifying an element, the reference may be referred to as a callout. In one example, multiple drawings depicting the same element (partially or completely) may include the same callout to identify that element. In another example, a drawing of a complete view of an element may include a reference to another drawing of a detail view of the respective element.

As explained in greater detail below, then, the document collection system 102 of the integrated visualization and analysis system 100 may be generally configured to receive documents and collect pages according to logical relationships between the pages, with the pages being collected as a document collection for panoptic visualization (a panoptic visualization document collection). As indicated above, in various examples, these documents may include system-related documents for a complex system. The 3D model collection system 104 may be generally configured to receive a digital 3D representation (model) of a complex system, and generate one or more two-dimensional (2D) derivatives therefrom. In one example, the 3D model collection system may then communicate these 2D derivatives to the document collection system as one or more system-related documents for the respective complex system.

The document layout system 106 may be generally configured to generate a layout of panoptically-arranged, logically-related pages of a panoptic visualization document collection, such as the collection from the document collection system 102. The document navigation system 108 may be generally configured to select and provide navigation option(s) for navigating a visual presentation of a layout of panoptically-arranged, logically-related pages of a panoptic visualization document collection, such as the layout generated by the document layout system. The visual definition system 110 may be generally configured to integrate data and information for a complex system thereby and produce a visual definition of the complex system for visualization and analysis. As suggested above and explained below, this data and information may include data for a physical instance of the complex system, a visual presentation of a 3D model of the complex system, and a layout of panoptically-arranged document components for the complex system including at least some 2D images of the complex system's elements.

The topical-element analysis system 112 may be generally configured to identify one or more topical elements of a complex system, and apply a visual effect to those elements depicted by a visual presentation of a 3D model of the complex system to distinguish them from other elements. The spatial-based search system 114 may be generally configured to perform spatial-based searches for pages of a panoptic visualization document collection, such as the collection from the document collection system. In one example, these queries may be for pages depicting elements of a complex system at a particular location or within (partially or completely) a volume about or defined by one or more particular locations within a coordinate system of the complex system. The visual presentation of a layout may at times be generally referred to as simply the layout.

Reference will now be made to FIGS. 2-8, which illustrate more particular examples of a suitable document collection system, 3D model collection system, document layout system, document navigation system, visual definition system, topical-element analysis system and spatial-based search system, respectively, according to example implementations of the present disclosure.

Figure 2:
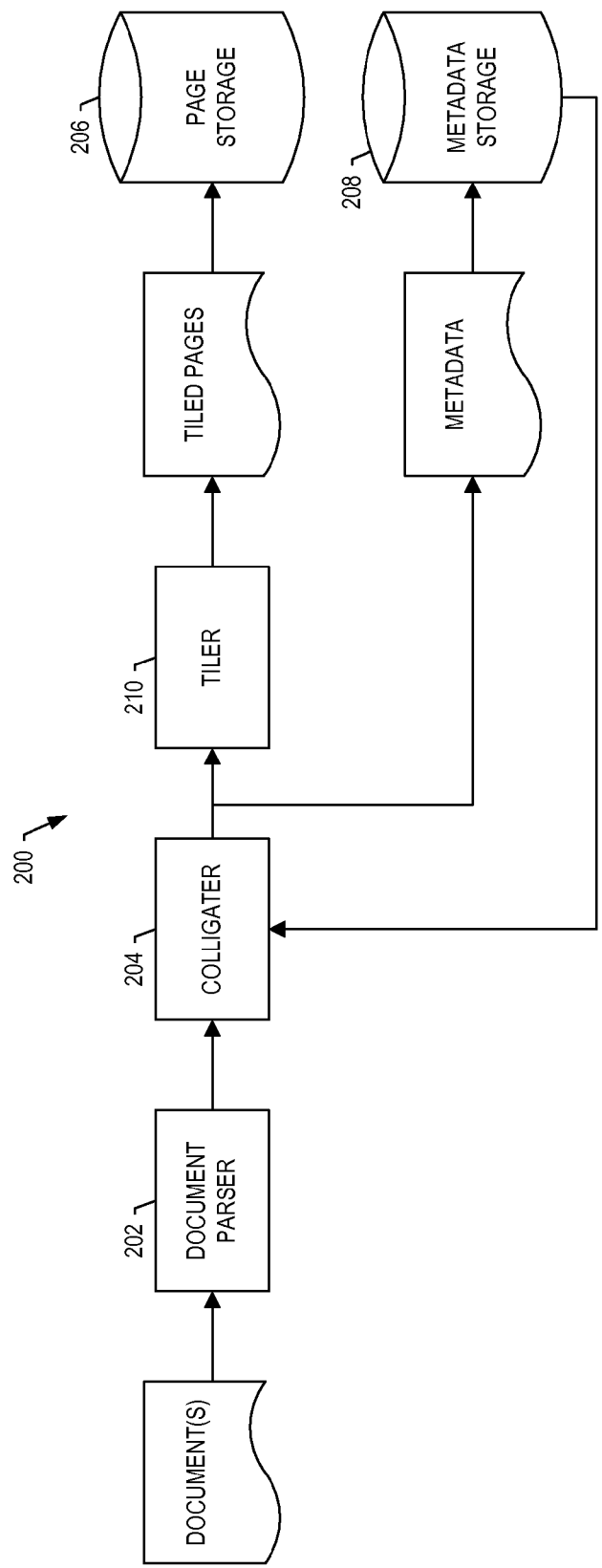
FIG. 2 is an illustration of a panoptic visualization document collection system in accordance with one example implementation.

FIG. 2 illustrates a document collection system 200 according to one example implementation. As shown, the document collection system may include a document parser 202 configured to receive and disassemble one or more electronic documents into a plurality of constituent pages (document components) each of which includes respective media content. The documents in one example may be disassembled according to the type of the documents (e.g., system-related documents, computer-aided design documents, presentation documents, graphics documents, video documents, medical documents, financial documents, legal documents, art/architecture documents, books, articles, web pages, engineering diagrams, technical drawings, wiring diagrams, sensor documents, etc.). The document parser may therefore also be configured to identify the type of the documents, such as based on the format of the documents, business rules or by user input. In one example, the documents may include one or more documents with pages not produced from a 3D model of a complex system, in contrast to other pages that may be produced from such a 3D model, as explained in greater detail below.

The document collection system 200 may also include a colligater 204 coupled to the document parser 202 and configured to colligate the pages. In this regard, the colligation of the pages may include, for each of one or more pages of the plurality, the colligater being configured to identify one or more links between the page and one or more other pages of the plurality. The link(s) of one example may be identified according to the documents, type of documents, and/or media content of the page and other page(s). In a more particular example, the link(s) may be identified according to the structure of the document, which as indicated above, may be defined according to a particular schema. And in one example, the link(s) may be defined in a number of different manners, such as according to one or more business rules, logic, schema or the like. These link(s) may establish one or more logical relationships between the page and other page(s).

In one example, a link may be identified between pages sharing a common document (constituents of the same document). In one example, a link may be identified between pages adjacent one another in a predetermined sequence, such as a time sequence, spatial sequence or an order sequence in a common document or collection of documents. In some instances, a link may be identified according to the subject(s) or object(s) of the pages. For example, a link may be identified between pages sharing a common subject or common object. In one example, a link may be identified between pages in which an object of one is a subject of the other (object-subject), or in which a subject of one is an object of the other (subject-object).

In one example, a link may be identified between pages related by a parent-child relationship, whether directly or indirectly by children sharing a common parent. In one example, a link may be identified between pages in instances in which one of the pages includes a reference or link to the other page in its media content. In this regard, a court decision may include a citation to another court decision (e.g., in the body of the court decision, or in a footnote, endnote or the like), or a page may include a hyperlink to another page. And in yet another example, a link may be identified between pages by user input specifying a link between pages.

In a more particular example in the context of a system-related document, a link may be identified between pages sharing a common system-related document, or pages adjacent one another in order sequence in a common system-related document. Link(s) may be identified between pages according to one or more spatial, design or functional relationships between element(s) of the complex system depicted by the pages, such as by 2D images of the pages. A link may be identified between pages depicting the same element (partially or completely). A link may be identified between a page depicting the complex system, and pages depicting the complex system's subsystems, parts or features. Similarly, a link may be identified between a page depicting a subsystem, and pages depicting the subsystem's parts or features. And a link may be identified between a page depicting a part, and pages depicting the part's features. In one example, at least one link may be identified between a page produced from a 3D model of the complex system (described below), and one of the other pages not produced from such a 3D model.

In other examples, link(s) may be identified between pages according to maintenance tasks performed on or using elements of the complex system, and the respective elements. A link may be identified between a page depicting an element of a complex system (partially or completely) and a page depicting a maintenance task (partially or completely) performed on or using the respective element. Likewise, a link may be identified between a page depicting a maintenance task (partially or completely) performed on or using an element and a page depicting the respective element (partially or completely). In various instances, these examples may reflect an object-subject or subject-object relationship, or may reflect a parent-child or other hierarchical relationship.

In yet other examples, link(s) may be identified between pages according to one or more maintenance tasks depicted by the pages. A link may be identified between pages depicting the same maintenance task. A link may be identified between pages depicting subtasks of the same maintenance task. Similarly, link may be identified between pages depicting actions of the same subtask. A link may be identified between a page depicting a maintenance task, and pages depicting the task's subtasks or actions. And a link may be identified between a page depicting a subtask, and pages depicting the subtask's actions.

In addition to identifying link(s) between pages, the colligator 204 may also be configured to extract, generate or otherwise provide, for each of one or more pages, metadata associated with the page. For a page, its associated metadata may provide any of a number of different pieces of structured information about the page. For example, the metadata may provide information identifying the link(s) between the page and other page(s) in metadata associated with the page. This information may include the names or other identifiers of the other page(s) linked to the page, and may also include an indication of the logical relationship(s) established by the link(s) therebetween (e.g., share common document, subject and/or object, adjacency, object-subject subject-object, parent-child, reference/link, user specified, etc.).

In addition to the link(s), the associated metadata for a page may include one or more other pieces of information about the page. For example, the metadata may provide information regarding the document for which the page is a constituent, such as the name or other identifier of the document, and/or an author, size, and/or time of creation or last revision of the document. Also for example, the metadata may provide information about the media content of the page. This information may include, for example, identification of the page's subject(s) and/or object(s), the portion of the page including one or more of the object(s), and/or a level of detail of one or more of the object(s) in the page.

In the context of a system-related document for a complex system, for example, the information provided by the metadata may include identification of and possibly other information regarding elements of the complex system (e.g., complex system, subsystems, parts, features). This information may include, for example, information (e.g., name, number, quantity, source, position, related elements) similar to that described above for a list of information regarding the complex system and/or one or more of its elements. For various system-related documents such as 2D derivatives of 3D models, the information may include for each of one or more elements, information that reflects the 3D geometry of the element within the coordinate system of the complex system, such as its a spatial location, volume extent, center of mass (or gravity) or the like. In various instances, a link between pages sharing a common subject, object or having an object-subject or subject-object relationship may be inferred from the metadata identifying the respective documents' subject(s) and/or object(s). In these instances, specification of a page's subject(s) and/or object(s) may suffice as information identifying the appropriate link(s) between pages.

The metadata may also provide information about one or more content restrictions applied or to be applied to the page, such as access restrictions, editing or modification restrictions, and/or encryption of the page. In one example in the context of a system-related document for a complex system such as aircraft, content restrictions may be applied on one or more bases such as organization (airline customer), type of or individual complex system (e.g., type of or individual aircraft), element of the complex system, maintenance task or the like. In this example, the information about the content restrictions may relate back to or otherwise incorporate other metadata, such as in the context of identification of users, types or individual complex systems, or information regarding its elements or maintenance tasks, which may be reflected elsewhere in the metadata.

In one example, the colligation of pages may further include the colligater 204 being configured to identify one or more layout models for at least some of the pages. In this example, the associated metadata extracted, generated or otherwise provided by the colligater for a page may further include information specifying an arrangement of the respective page in each of one or more of the layout models. For a respective layout model, this may include, for example, specifying a size, location and/or depth (z-order) of the page (or more particularly its visual representation). The layout model(s) may be identified and size, location and/or depth may be specified in any of a number of different manners, such as according to one or more business rules, logic or the like.

Examples of suitable layout models (sometimes referred to as styles of presentation) include brickwall, partial brickwall, hierarchy, shape, center out, top-down/triangulated, center-out triangulated, size dominance, overlap through detail, master-detail through depth, load shape, facet, mixed-media/static-and-dynamic or the like. Other examples may include combinations of one or more of the foregoing layout models. Each of a number of example layout models will be further described below.

In one example, the size of a page in a layout model may be specified as an absolute size or a relative size, either of which may be given in a number of different manners. In various instances, the size of the page may relate to a size in pixels and therefore give a pixel count or pixel resolution of the page. In one example, the absolute size of a page may be given in height and width dimensions (e.g., N×M pixels). In another example, the size of the page may be specified as a relative size based on the size of one or more other pages to which the page is logically related. For example, the relative size may be given in a number of different manners, such as in a percentage, fraction or multiple of other page(s); or the relative size may be given simply by an indication of smaller than, larger than or equal in size to other page(s). In pages related by a parent-child relationship, for example, the size of the child page may be specified as being half the size of its parent. In any event in which the size is relative, the size of the respective other page(s) may be given in their associated metadata, and may be given as an absolute size or relative size based on the size of even further other pages.

Similar to size, in one example, the location (sometimes referred to as position) of a page in a layout model may be specified as an absolute location or relative location, but in either event, may be given in a number of different manners. Likewise, the depth of a page in a layout model may be specified as an absolute depth or relative depth, either of which may be given in a number of different manners. For example, the absolute location of the page may be given in x, y coordinates of a coordinate system that spans the layout model, and/or the absolute depth may be given in a z coordinate of the coordinate system. In another example, the relative location of the page may be given in x, y coordinates relative to a point or other page(s) in the layout model. In yet another example, the relative location may be given simply by an indication of above, below, left or right of a point or other page(s) in the layout model. Similarly, in one example, the relative depth may be given simply by an indication of a page being in-front or behind other page(s) in the layout model. In any event in which the location and/or depth is relative, the location and/or depth of the respective other page(s) may be given in their associated metadata, and may be given as an absolute or relative location and/or depth.

The colligater 204 may be configured to communicate the pages and metadata as a panoptic visualization document collection, and communicate the collection to any of a number of different destinations. In one example, the colligater may be configured to communicate the pages and metadata to respective storage 206, 208 for later retrieval. The storage may be resident with the document collection system 200, or may be separate from and in communication with the document collection system. The pages and metadata may be formatted and stored in any of a number of different manners, and hence, their storage may be of any of a number of different types. Examples of suitable types of storage include file storage, database storage, cloud storage or the like.

In various examples, before pages are stored in respective storage 206, the pages may be compressed or otherwise processed for easier storage and retrieval. As shown, for example, the system may include a tiler 210 coupled to the colligater, and to which the colligater is configured to communicate the pages. The tiler may be configured to generate, for each of one or more pages, visual representations of the page at respective resolutions for zoom levels of the page. As described herein, the page (or rather its visual representation) at each zoom level may be generally referred to as a "sub-image," and may at times be considered a separate version or copy of the page. As suggested above, however, a sub-image of a page need not necessarily include a still image as the page may include other types of media content.

In addition to or in lieu of generating sub-images of a page, the tiler 210 may be configured to divide the sub-images across the zoom levels into progressively larger numbers of tiles each of which covers a spatial area of a sub-image at a respective zoom level. This may facilitate retrieval, panning and/or zooming of the page, as explained further below. The tiler may then be further configured to communicate the tiles of the sub-images of the pages, such as to the page storage. Before communicating the tiles, however, the tiler may be further configured to compress the tiles, if so desired.

In one more particular example, the tiler 210 may be configured to generate multiple resolutions of a page at respective zoom levels arranged hierarchically from a top zoom level through one or more intermediate zoom levels to a base zoom level. Each zoom level includes a sub-image of the entire page but at a different resolution; and the sub-images of the page across zoom levels may have the same native aspect ratio (ratio of the width of the image to its height). In one example, the top zoom level (level 0) may include a sub-image of the entire page at its lowest resolution, the one or more intermediate zoom levels may include a sub-image of the entire page at progressively higher resolutions (level 1 immediately below level 0, level 2 immediately below level 1, etc.), and the base zoom level (level L) may include a sub-image of the entire page at its highest (or full) resolution.

Each sub-image of a page may be generated in any of a number of different manners. In one example, one of the sub-images may be received by the tiler 210, such as the full-resolution sub-image. The tiler may then be configured to generate the other sub-images at lower resolutions, such as by downsampling the full-resolution sub-image.

As indicated, the tiler 210 may be configured to divide sub-images across zoom levels into progressively larger numbers of tiles each of which covers a spatial area of a sub-image at a respective zoom level. The tiles may have a fixed size (resolution) within and across the zoom levels, and accordingly, a sub-image composed of a larger number of tiles may generally have a higher resolution than a sub-image composed of a smaller number of tiles. Each zoom level may therefore be considered a higher zoom level relative to any zoom level above it (the sub-image at the zoom level being at a higher resolution than the sub-image at any zoom level above it). Similarly, each zoom level may be considered a lower zoom level relative to any zoom level below it (the sub-image at the zoom level being at a lower resolution than the sub-image at any zoom level below it).

In one example, the sub-image at each zoom level may be half the resolution of the zoom level immediately below it, and twice the resolution of the zoom level immediately above it (the resolutions increase or decrease by a factor of two). In this example, the number of tiles in a zoom level l may be given by $t_l = t_0 \times 4^l$, in which l=0, 1, 2, ... L, and $t_0$ represents the number of tiles in the top zoom level (level 0). In a more particular example including four zoom levels 0, 1, 2 and 3 (L=3), and in which the top zoom-level sub-image is composed of 1 tile ($t_0$=1), the first intermediate zoom-level (level 1) sub-image may be composed of 4 tiles, the second intermediate zoom-level (level 2) sub-image may be composed of 16 tiles, and the base zoom-level (level 3) sub-image may be composed of 64 tiles.

In one example, a page covered by a number of tiles in one zoom level may be covered by an increased or decreased number of tiles in higher or lower zoom levels, respectively, thereby leading to an increase or decrease in resolution of the page. Similarly, an area of a page covered by one tile in one zoom level may be covered by multiple (e.g., four) tiles in an adjacent higher zoom level, thereby leading to an increase in resolution of the respective area of the page. And an area of a page covered by multiple tiles in one zoom level may be covered by one tile in an adjacent lower zoom level, thereby leading to a decrease in resolution of the respective area of the page.

In one example, a page (or area thereof) at a particular resolution may be displayed by the tile(s) covering the page at the zoom level commensurate with the particular resolution. A zoom-in of the page may be effectuated by replacing the displayed tile(s) with the increased number of tiles covering the page at a higher zoom level. And a zoom-out of the page may be effectuated by replacing the displayed tiles with the decreased number of tile(s) covering the page at a lower zoom level. And because the page may be divided into tiles, in instances in which a portion but not all of a page is viewable in a graphical user interface (GUI) in which the page is displayed, only those tiles covering the viewable portion of the page may be retrieved and displayed.

Figure 3:
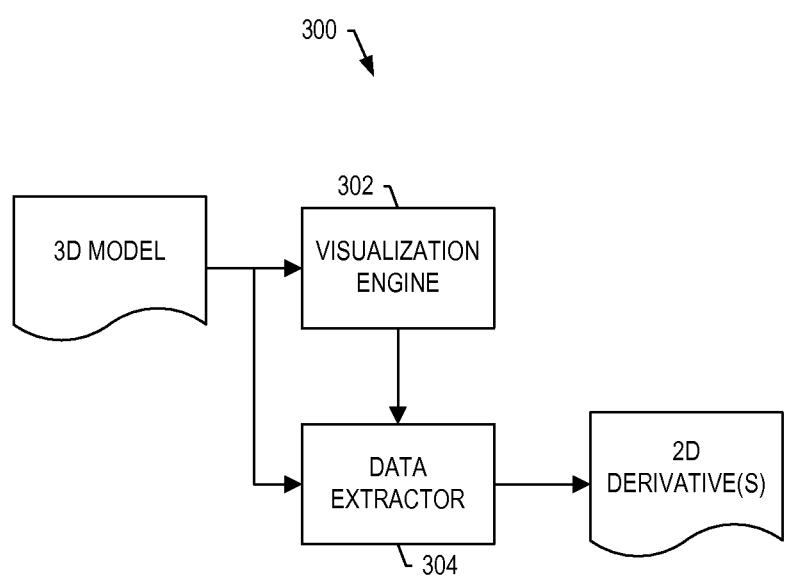
FIG. 3 is an illustration of a panoptic visualization three-dimensional (3D) model collection system in accordance with one example implementation.

Reference is now made to FIG. 3, which illustrates a 3D model collection system 300 according to one example implementation. As indicated above, the 3D model collection system 300 may be one example of the 3D model collection system 104 of the integrated visualization and analysis system 100 of FIG. 1. The 3D model collection system may be generally configured to receive a digital 3D representation (model) of a complex system, and generate one or more two-dimensional (2D) derivatives from the 3D model, which may then be communicated as one or more system-related documents.

As shown in FIG. 3, the 3D model collection system 300 may include a visualization engine 302 configured to receive a digital 3D model of a complex system, such as a 3D CAD or other similar model (sometimes referred to as a solid model). In one example, the 3D model may represent the complex system as a collection of "primitives" such as edges, faces, points (e.g., vertices) and the like, which may be arranged into polygons or other arithmetically-derived structures to reflect the geometry of surfaces, volumes or elements of the respective complex system. The complex system may be defined by a "boundary" representation, or collection of polygons that demarcate the space occupied by the complex system, which may include sub-collections of polygons that demarcate spaces occupied by respective elements of the complex system. Each of these sub-collections of polygons may be referred to as a 3D object that corresponds to an element of the complex system in the 3D model. For some complex systems, the 3D model may use hundreds of thousands of polygons, which may be arranged in thousands of sub-collections of polygons (3D objects) corresponding to several thousands of elements.

The 3D model may include information that may indicate a design type of the model, such as an art concept, preliminary design, released design or the like. The 3D model may include information (e.g., name, number, quantity, source, position, related elements) similar to that described above for a list of information regarding the complex system and/or one or more of its elements. The 3D model may even further include additional information that in some examples, with the 3D model, may compose a model-based definition (MBD) of the complex system. For example, the 3D model may include product manufacturing information (PMI) such as geometric dimensions and tolerances (GD&T), material specifications, component lists, process specifications, inspection requirements or the like. This information may convey engineering intent (EI), which may reflect the designer's intent for how the complex system should be fabricated, assembled, operated, maintained or the like. In various examples, this additional information may be provided directly in the 3D model, or in metadata associated with the 3D model.

The visualization engine 302 may be capable of interpreting the 3D model of the complex system and configured to produce one or more pages (electronic document components) including 2D images depicting elements of the complex system (e.g., complex system, subsystems, parts, features). In this regard, each page produced by the visualization engine may include one or more 2D images depicting one or more elements. These 2D images may include orthographic projection drawings, and each page may include one or more such drawings. In one example, each page may include a projection view, front view, top view, right-side view and/or left-side view of element(s) of the complex system.

In one example, the visualization engine 302 may be configured to produce pages of 2D images according to spatial, design or functional relationships between elements of the complex system, which in one example may be interpreted from information included with the 3D model. In this regard, the visualization engine may be configured to produce page(s) of 2D image(s) depicting elements of the complex system related to one another spatially, by-design or functionally within the complex system. For example, the visualization engine may be configured to produce a page of 2D image(s) depicting the complex system, and pages of 2D image(s) depicting the complex system's spatially, by-design or functionally-related subsystems, parts or features. In another example, the visualization engine may be configured to produce a page of 2D image(s) depicting a subsystem, and pages of 2D image(s) depicting the subsystem's spatially, by-design or functionally-related parts or features. And in yet another example, the visualization engine may be configured to produce a page of 2D image(s) depicting a part, and pages of 2D image(s) depicting the part's spatially, by-design or functionally-related features.

The visualization engine 302 may include or otherwise be coupled to a data extractor 304 configured to generate 2D derivatives of the 3D model. For each of one or more pages, for example, the data extractor may be configured to receive the page including a 2D image depicting an element of the complex system, and extract from the 3D model, information, information regarding element(s) depicted by the respective 2D image(s). The extracted information may include any of a variety of information included with the 3D model, such as that described above. In a more particular example, the extracted information may include the name/number of the complex system. The extracted information may include information identifying a spatial, design or functional relationship between the respective element depicted by the 2D image and one or more other elements of the complex system. For example, for each element depicted by a 2D image, the extracted information may include names/identifiers of any other elements spatially, by-design or functionally-related to the respective element, and may include an indication the relationship.

In one example, the extracted information may include for each element depicted by a 2D image, information that reflects the 3D geometry of the element within the coordinate system of the complex system, such as its a spatial location, volume extent, center of mass (or gravity) or the like. In some examples, this information may be provided by or derived from the 3D object (sub-collections of polygons) of the 3D model that corresponds to the element. The spatial location or center of mass/gravity of an element may be specified in absolute or relative terms, and may be given in a number of different manners. In one example, the location of an element may be given in x, y, z coordinates of various ones of its points (e.g., vertices); and similarly, for example, its center of mass/gravity may be given in x, y, z coordinates. In these and other examples, each set of coordinates may be given in one or more different manners such as minimums, maximums, means or the like.

The data extractor 304 may also be configured to associate with the page(s) of 2D image(s), the extracted information regarding element(s) depicted by the respective 2D image(s). In one example, the data extractor may be configured to provide the extracted information in metadata associated with respective page(s). The data extractor may thereby be configured to generate 2D derivative(s) of the 3D model, with each 2D derivative including one or more page(s) of 2D image(s) and associated metadata. As indicated above, in various examples, the 2D derivative(s) may be communicated for inclusion in a panoptic visualization document collection, such as to the document collection system 102 of FIG. 1, or more particularly in one example, the document collection system 200 of FIG. 2. In these examples, the document collection system may process the 2D derivative(s) similar to other system-related documents, as explained above.

Figure 4:
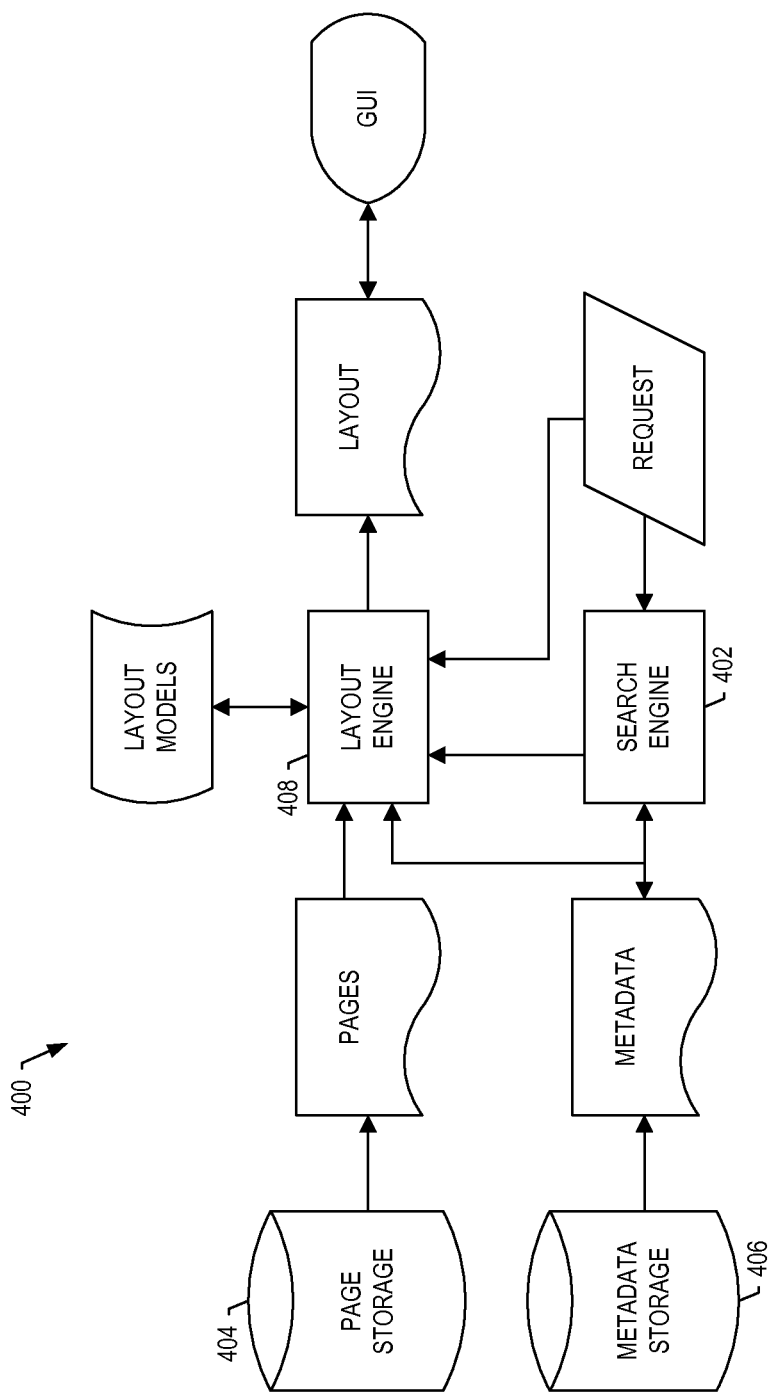
FIG. 4 is an illustration of a panoptic visualization document layout system in accordance with one example implementation.

Reference is now made to FIG. 4, which illustrates a document layout system 400 according to one example implementation. As indicated above, the document layout system 400 may be one example of the document layout system 106 of the integrated visualization and analysis system 100 of FIG. 1. The document layout system may be generally configured to generate a layout of panoptically-arranged, logically-related pages of a panoptic visualization document collection. This collection may be, for example, the collection from the document collection system 102, or more particularly in one example, the document collection system 200 of FIG. 2.

As shown in FIG. 4, the document layout system 400 may include a search engine 402, request interface or the like configured to receive a request for media content and identify one or more pages including the requested media content. For example, the search engine may be configured to receive a request for a depiction of one or more elements of a complex system, such as a drawing that graphically depicts element(s), a textual list that textually depicts element(s) and/or graphical or textual maintenance task(s) performed on or using element(s). The identified page may be of a panoptic visualization document collection having a plurality of pages each of which includes respective media content and has associated metadata providing information about the respective page. The pages and metadata may be stored in respective storage 404, 406, which in one example may correspond to respective storage 206, 208 shown in FIG. 2.

The search engine 402 may be configured to identify page(s) in a number of different manners, such as based on the associated metadata of the pages of the collection. For example, the request may include a keyword matching or otherwise having relevance to a subject or object of page(s) of the collection. In response to the request, then, the search engine may be configured to search the metadata storage 406 for the associated metadata of one or more page(s) including media content matching or relevant to the request.

The document layout system 400 may also include a layout engine 408, layout generator or the like coupled to the search engine 402 and configured to select a layout model (style of presentation) from a plurality of layout models for panoptically-arranged pages of the plurality, including the identified page. The layout models may be maintained in a respective storage such as file storage, database storage, cloud storage or the like, and formatted and stored in any of a number of different manners according to the respective storage.

The layout models may include any of a number of different types of layouts for panoptically arranging pages. As indicated above and explained further below, examples of suitable layout models include brickwall, partial brickwall, hierarchy, shape, center out, top-down/triangulated, center-out triangulated, size dominance, overlap through detail, master-detail through depth, load shape, facet, mixed-media/static-and-dynamic or the like. Other examples may include combinations of one or more of the foregoing layout models.

The layout engine 408 may be configured to select the layout model in any of a number of different manners. In one example, the layout engine may be configured to select the layout model according to the associated metadata for the identified page. The search engine 402 may therefore be configured to communicate the associated metadata for the identified page to the layout engine, which in turn, may be configured to select a layout model according to the respective associated metadata.

As explained above, the associated metadata for a page may provide information about the type of document of which the page is a constituent, and/or information about media content of the page. In one example, then, the layout engine 408 may be configured to select the layout model according to the type of the document of which the identified page is a constituent (e.g., system-related document, computer-aided design document, presentation document, graphics document, video document, medical document, financial document, legal document, art/architecture document, book, article, web page, engineering diagram(s), technical drawing(s), wiring diagram(s), sensor document(s), etc.). In another example, the layout engine may be configured to select the layout model according to the structure of the document of which the identified page is a constituent, and/or schema according to which the respective document is structured. In yet another example, the layout engine may be configured to select the layout model according to the media content of the identified page, such as one or more of its subject(s) and/or object(s).

As also explained above, the associated metadata for a page may include information identifying link(s) between the page and other page(s) of the collection. The layout engine 408 may therefore also be configured to retrieve the identified page and other page(s) identified according to the associated metadata for the identified page. These pages may be retrieved from respective storage 404.

In one example, the associated metadata for a page may include information about one or more content restrictions applied or to be applied to the page, such as access restrictions, editing or modification restrictions, and/or encryption of the page. In the context of a system-related document for a complex system, for example, content restrictions may be applied on one or more bases such as organization, type of or individual complex system, element of the complex system, maintenance task or the like. In this example, the document layout system 400 may request or otherwise receive information regarding the user requesting the media content. This information may include identification of the user and/or any credentials of the user, which may be received from the user or stored in a user profile matched to the user's identification.

In the foregoing example, the layout engine 408 may then be configured to retrieve the identified page and other page(s) in accordance with the user information and content restrictions to be applied to the respective pages. In this regard, a user affiliated with an organization may be restricted to only page(s) in which their associated metadata allows access to the respective organization, or perhaps to a type or individual complex system that may be associated with that particular organization. In another example, a user associated with element(s) of the complex system with which the user is particularly knowledgeable may be restricted to only those page(s) depicting the respective element(s). In these instances, views of the layout and thus its pages may be configurable in a number of different manners according to content restrictions placed on the pages.

The layout engine 408 may be configured to generate a layout of the retrieved pages, panoptically-arranged according to the selected layout model, and the retrieved pages and their associated metadata. In addition to retrieving the pages, then, the layout engine of one example may also be configured to receive the associated metadata, such as from respective storage 406. The layout engine may then be configured to communicate the layout, such as to a GUI in which a layout may be displayed, or a printer for generating a printout of the layout.

In various examples, the layout may include at least some of the pages of 2D derivatives of a 3D model of a complex system, without any other pages not produced from such a 3D model. In other examples, the layout may include at least some of the pages of 2D derivatives of a 3D model of a complex system, and may also include one or more other pages not produced from such a 3D model. In these examples, the pages of 2D derivatives may include pages of 2D images depicting element(s) of the complex system, and may have associated metadata including information reflecting the 3D geometry of the respective element(s) within the coordinate system of the complex system. If any are included in the layout, the other page(s) may likewise depict element(s) of the complex system, but these other page(s) may have associated metadata absent information reflecting the 3D geometry of their respective element(s) within the coordinate system of the complex system.

As suggested, the layout may define a panoptic arrangement of the retrieved pages according to the selected layout model. In the arrangement of the layout, the pages may each have a particular size, location and/or depth (z-order). The size, location and/or depth of each page of the layout may be absolute or relative to other page(s) of the layout, and may be specified or otherwise determinable in a number of different manners. In one example, the sizes, locations and/or depths may be specified or otherwise determinable from a definition of the selected layout model of the layout models. Additionally or alternatively, for example, the associated metadata for each page of the layout may provide information specifying the size, location and/or depth (z-order) of it in the layout, as explained above. In these examples, the layout engine 408 may be configured to generate the layout according to the sizes, locations and/or depths specified by the selected layout model and/or associated metadata of the pages of the layout.

The aspect ratios of the pages may be their native aspect ratios. In various instances, however, a layout model may specify or otherwise define, for each of one or more pages, an aspect ratio that is different from the native aspect ratio of the respective page. In these instances, the layout engine 408 may be further configured to generate the layout according to the different, non-native aspect ratio(s) for the page(s).

In one further example, one or more of the pages of the layout may be in a state including visual representations (e.g., sub-images) at respective resolutions. For each of these pages, the layout engine 408 may be configured to retrieve the page for the visual representation at the resolution that matches or most closely matches the size specified by the selected layout model and/or associated metadata. This may include, for example, retrieving the sub-image of the page at or closest to the respective resolution.

The layout generated by the layout engine 408 may be dynamically generated according to a selected layout model such that a different layout of the pages may be realized by changing the selected layout model. A different layout may also be realized in a number of other manners, such as based on associated metadata of the pages of the layout or one or more time-based factors. In one example, the layout engine may therefore be further configured to receive a request for a different panoptic arrangement of the retrieved pages. In this example, the layout engine may be configured to select a different layout model from the plurality of layout models in response to the request. The layout engine may then be configured to generate a different layout of the retrieved pages. This may include the layout engine being configured to panoptically rearrange the retrieved pages according to the selected different layout model, and the retrieved pages and associated metadata for the retrieved pages.

In various examples described more fully below, the search engine 402, page and metadata respective storage 404, 406 and/or layout engine 408 may be included within or otherwise coupled to one or more other systems, subsystems or the like, such as visual definition system 110 and/or spatial-based search system 114. In these examples, the visual definition system or spatial-based search system may cause the layout engine to select a layout model and generate a layout of the pages, panoptically-arranged, such as in a manner the same as or similar to that explained above or otherwise herein.

As indicated above, the layout models may include any of a number of different types of layouts for panoptically arranging pages. In the layout models, logical relationship(s) established by link(s) between pages may be expressed by the arrangement of pages, in either or both of location or depth (z-order). In one example, logical relationships may be expressed by the proximity of pages to one another in their locations, and/or in their relative depths. Additionally, one or more of the layout models may define or imply a navigation path between documents related to one another, and/or a load shape for loading pages of a layout generated according to the respective layout models. FIGS. 9 and 10 schematically illustrate examples of suitable layout models in the form of a brickwall and hierarchy, respectively. For further details regarding other examples of suitable layout models, see at least the aforementioned '987 application.

FIG. 9 illustrates a brickwall layout model 900 according to one example implementation in which pages 902 may be arranged in one or more rows and one or more columns. As shown, the brickwall layout model may be characterized by a consistent end-to-end orientation with the pages being consistent in size and/or aspect ratio along one or more rows and/or columns. This type of layout model may be used for general search results. In one example, the layout model may provide a horizontal orientation related to chapter location, with a vertical orientation associated with a progressive increase in page length.

Although not separately shown, a partial brickwall layout model may be considered a superset of the brickwall layout model 900. The partial brickwall layout model may be characterized by clusters of pages that may similarly be consistent in size and/or aspect ratio at least within respective clusters. In this layout model, the clusters may be related by associated metadata of the respective pages, such as by their media content, author, time of creation, last revision or the like.

FIG. 10 illustrates a hierarchy layout model 1000 according to one example implementation in which pages may be arranged in a hierarchy in location and/or size. A hierarchical relationship between pages (hierarchically-related pages) may be indicated by their associated metadata in a number of different manners. For example, a hierarchical relationship may be indicated by a parent-child relationship between pages. In another example, a hierarchical relationship may be indicated by an object-subject or subject-object relationship in which an object of one page higher in a hierarchy may be subject(s) of other page(s) lower in the hierarchy, and in which at least some of the respective other page(s) may be at the same level in the hierarchy. In this example, the subject of the one page may be a master view, and the subject(s) of the other page(s) may be detailed view(s) of object(s) of the master view. In yet another example, a hierarchical relationship may be indicated by a relationship in which one page higher in a hierarchy includes reference(s) or link(s) (e.g., citation, hyperlink, etc.) to other document(s) lower in the hierarchy, in which at least some of the respective other document(s) may be at the same level in the hierarchy.

In one example of the hierarchy layout model 1000, pages higher in a hierarchy may be located above those lower in the hierarchy (top-down), and/or may be larger in size than those lower in the hierarchy. The pages in this layout model may not be consistent in size or aspect ratio. Those pages higher in the hierarchy may dominate those lower in the hierarchy, and in which pages lower in the hierarchy may be constrained in the x-direction by the width of pages higher in the hierarchy.

More particularly, for example, the highest page 1002 in the hierarchy may be located at the top, and may be sized according to the page's full resolution with its native aspect ratio. The next-highest page(s) 1004 in the hierarchy may be located immediately below the highest page at a size smaller than the highest page, and with an aspect ratio that constrains the next-highest page(s) collectively to the width of the highest page. This pattern may repeat for the third-highest page(s) 1006 in the hierarchy below respective ones of the next-highest pages, for the fourth-highest page(s) 908 in the hierarchy, and so forth. This layout model may in one example provide a single page with related pages cited in the respective page below it.

Now turning back to FIG. 5, a document navigation system 500 is shown according to one example implementation. As indicated above, the document navigation system 500 may be one example of the document navigation system 108 of the integrated visualization and analysis system 100 of FIG. 1. The document navigation system may be generally configured to select and provide navigation option(s) for navigating a layout of panoptically-arranged, logically-related pages of a panoptic visualization document collection. In one example, this may include the collection from the document collection system 102 (e.g., document collection system 200). Additionally or alternatively, for example, it may include the layout generated by the document layout system 106 (e.g., document layout system 400).

Figure 5:
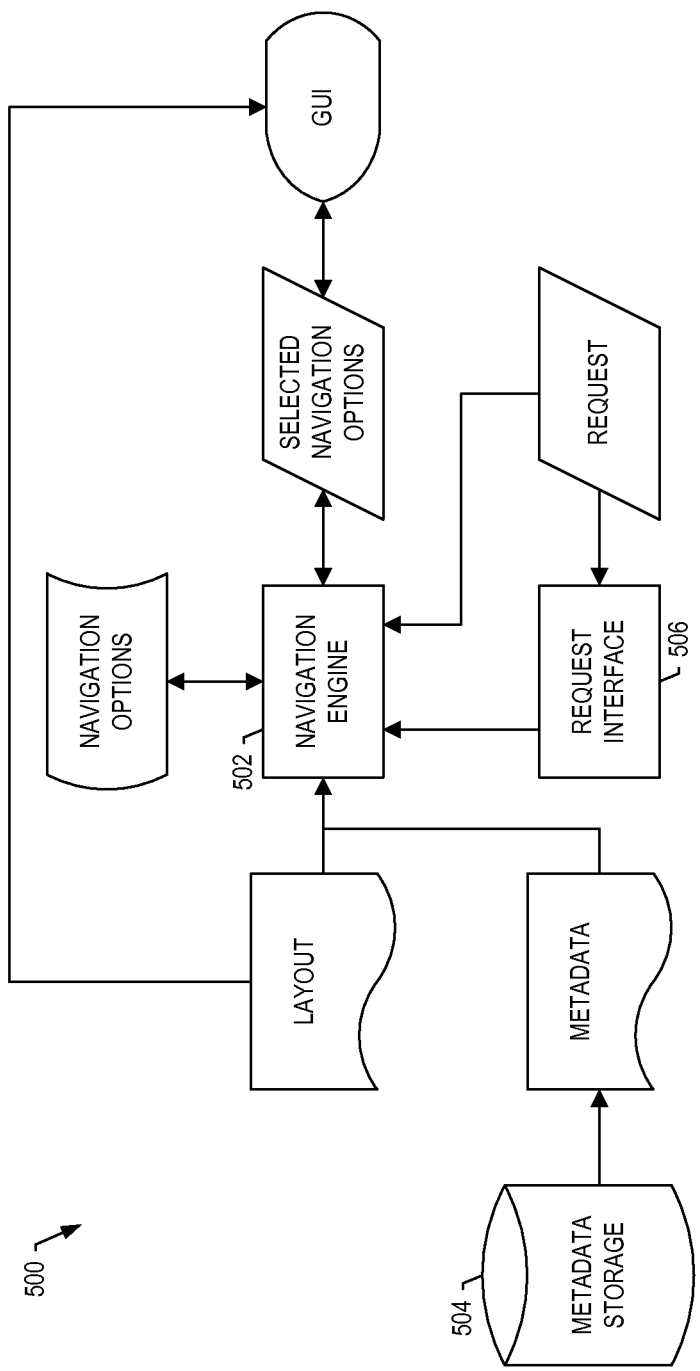
FIG. 5 is an illustration of a panoptic visualization document navigation system in accordance with one example implementation.

As shown in FIG. 5, the document navigation system 500 may include a navigation engine 502 configured to receive a layout of pages (document components) of a panoptic visualization document collection. The collection may have a plurality of pages each of which includes respective media content and have associated metadata providing information about the respective page. The layout may include a panoptic arrangement of visual representations of the pages of the layout according to the associated metadata of the respective pages.

The navigation engine 502 may also be configured to select one or more navigation options from a plurality of navigation options for navigating the layout, in which the navigation options may be selected according to the associated metadata for the pages of the layout. The navigation options may be maintained in a respective storage such as file storage, database storage, cloud storage or the like, and formatted and stored in any of a number of different manners according to the respective storage. Similarly, the metadata for the pages of the layout may be stored in a respective storage 504, which in one example may correspond to either or both of storage 208, 406. The navigation engine may also be configured to communicate the selected navigation options, such as to a GUI in which the selected navigation options may be presented along with the layout.

In one example, the navigation engine 502 may be configured to select navigation options according to the type(s) of document(s) of which the pages of the layout are constituents, which may be indicated in the associated metadata for the pages. In one example, the navigation engine may be configured to select navigation options according to the media content of the pages of the layout, such as their subject(s) and/or object(s), which may also be indicated in the associated metadata. Examples of suitable navigation options for a layout include command tools (e.g., pan, rotate, zoom, obscure/show, home, etc.), annotation tools (e.g., timeline/milestone, callous, etc.), linking tools (hyperlink, hotlink, hotshot, etc.), navigation path tools (e.g., tracking, recording, etc.), metadata tools (e.g., search, filter, insertion, etc.), page tools (e.g., search, filter, cue, activation, size, location, dominance, logical relationship(s), etc.), layout-model change, co-navigation, hyper-hypo navigation, printing or the like.

The associated metadata for the pages of the layout may directly or indirectly affect the selected navigation options. In one example, the associated metadata may be retrieved to directly affect the navigation options selected by the navigation engine 502. Additionally or alternatively, for example, the associated metadata for the pages may affect their layout, such as by affecting a selected layout model according to which the layout may be generated. More particularly, for example, the layout of pages may be generated according to a layout model selected according to the type of document(s) of the pages, and/or media content of the pages. The layout may then affect the navigation options selected by the navigation engine. In either event of the associated metadata directly or indirectly affecting the selected navigation options, the navigation engine may be said to select navigation options according to the associated metadata for pages of the layout.

The document navigation system 500 may also include a request interface 506 coupled to the navigation engine 502 and configured to receive a request according to one or more of the selected navigation options. The request interface may be configured to communicate the request to the navigation engine. The navigation engine may in turn be further configured to effect an adjustment of the visual representation of the layout in response to the request and according to the request, and communicate the adjustment such as to the aforementioned GUI. In one example, the navigation engine may be configured to effect the adjustment of the visual representation without adjustment of the layout itself. In another example, the navigation engine may be configured to effect the adjustment of the visual representation including adjustment of the layout.

As suggested above, the selected navigation options may be affected by a layout and/or its pages, or in one more particular example, the associated metadata for the pages of a layout. In various instances, then, layouts of different pages may result in the selection of one or more different navigation options. For example, consider that the navigation engine 502 may at different times receive a layout of first pages and a separate layout of second pages, with each layout including a panoptic arrangement of respective pages. In this example, the navigation engine may select first navigation options for the first layout, and second navigation options for the second layout. The first and second pages may include one or more common pages, but in one example, may also include one or more different pages. In this example, the first and second layouts may be different at least in that the first and second pages include one or more different pages. And in turn, the first and second navigation options selected by the navigation engine may include one or more different navigation options—although similar to the first and second pages, the first and second navigation options may include one or more common navigation options.

In various examples described more fully below, the metadata storage 504 and navigation engine 502 may be included within or otherwise coupled to one or more other systems, subsystems or the like, such as visual definition system 110 and/or spatial-based search system 114. In these examples, the visual definition system or spatial-based search system may cause the navigation engine to select navigation option(s), and/or receive a request to and effect an adjustment of the layout (and/or metadata), and communicate the adjustment, such as in a manner the same as or similar to that explained above or otherwise herein.

The navigation engine 502 may be configured to select any of a number of different navigation options for a layout of pages. Many layouts generated according to many different layout models, and including pages of many different types of documents, may include metadata tools such as search, filter, insertion or the like, which may operate with respect to the associated metadata for pages of the layout. The search and filter options may permit a user to search the associated layout for particular metadata, or filter the associated metadata to include or exclude particular metadata. The insertion option may permit the insertion of particular metadata to the visual presentation of the layout, such as in the form of a callout including the particular metadata referenced to page(s) for which the associated metadata includes the particular metadata.

The navigation options may include page tools such as search, filter, cue, activation, size, location, dominance, logical relationship(s) or the like. Similar to the metadata tools, the search and filter options may permit a user to search the pages of the layout for particular page(s) or particular media content. In this regard, the search and filter options may implicate the associated metadata for pages of the layout.

The cue option may permit the application of one or more visual effects to one or more pages to draw the user's attention to those page(s) in the layout. The visual effect may be any of a number of different effects. Examples of suitable visual effects include an opaque or translucent border of a noticeable color (e.g., yellow) around the page(s), an opaque or translucent visual object or shape smaller than and overlaying the page(s) or a translucent visual object or shape the same or greater in size than and overlaying the page(s), or the like, Examples of other suitable visual effects include an increase in a size of the page(s), an animation applied to the page(s), or the like.

The visual effect(s) may be triggered in any of a number of different manners, as may the page(s) to which the effect(s) are applied. For example, visual effect(s) may be triggered to indicate selection of one or more page(s). In this example, the visual effect(s) may be applied to the selected page(s). Additionally or alternatively in this example, visual effect(s) may be applied to page(s) having a particular logical relationship with the selected page(s) (e.g., share common document, subject and/or object, adjacency, object-subject subject-object, parent-child, reference/link, user specified, etc.). In another example, visual effect(s) may be applied to page(s) to indicate a navigation path followed by the user. For further details regarding these and other examples of suitable navigation options, see at least the aforementioned '964 application.

Figure 6:
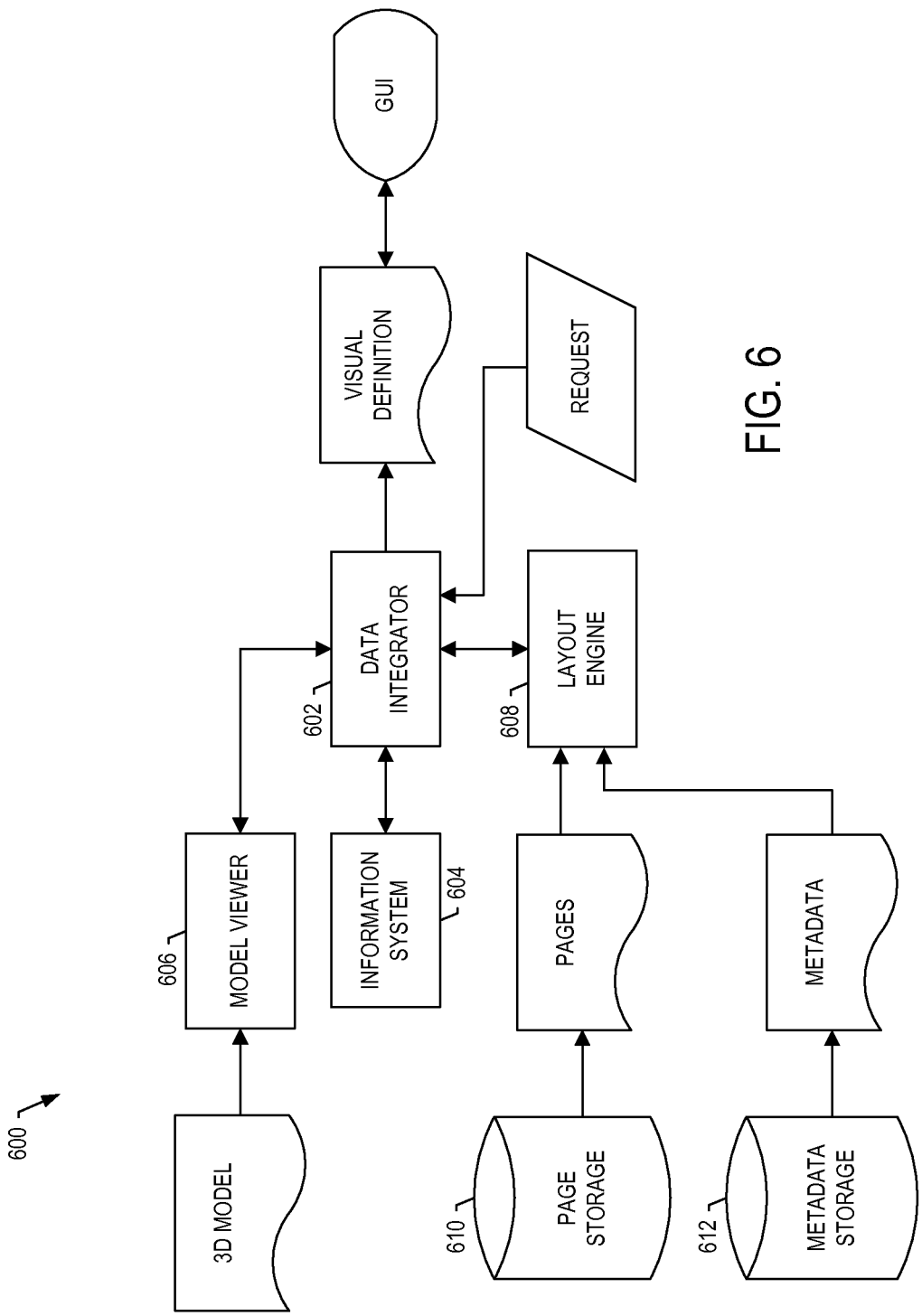
FIG. 6 is an illustration of a visual definition system in accordance with one example implementation.

FIG. 6 illustrates a visual definition system 600 is shown according to one example implementation. The visual definition system may be one example of the visual definition system 110 of the integrated visualization and analysis system 100 of FIG. 1. The visual definition system may be generally configured to integrate various information-based components fir a complex system and thereby produce a visual definition of the complex system for visualization and analysis. These information-based components may include, for example, data for a physical instance of the complex system, a visual presentation of a 3D model of the complex system, and a layout of panoptically-arranged pages (document components) at least some of which include 2D images depicting at least some of the complex system's elements.

As shown, for example, the visual definition system 600 may include a data integrator 602 configured to receive data for a physical instance of the complex system. For receipt of this data, the data integrator may be coupled to any of a number of different computer-based sources of data, information systems or the like, generally referred to at times as one or more information systems 604. The data for the physical instance may include a list of the plurality of elements of the complex system (the data in some examples thereby textually depicting the elements). The list may reflect a relationship such as parent-child or other hierarchical relationship, between at least some of the plurality of elements. In some examples, the list may be from a bill of materials or indentured parts list for the complex system, or may otherwise be the same or similar to that of various maintenance documents or other system-related documents for the complex system (e.g., CDL, EL).

In some examples, the data integrator 602 may further receive additional data for elements of the plurality of elements. The data integrator may receive this additional data from the same or another one or more information systems 604. This additional data may include physical data and/or logical data, and in some examples, may include data the same or similar to that of various maintenance documents or other system-related documents for the complex system. Examples of suitable additional data includes a name, number or other identifier of the element, a required quantity of the element, the source of the element, the position of the element, related complex system/element identifiers or the like. Additionally, or alternatively, the additional data may include one or more references that identify the element in one or more system-related documents, and/or one or more references that identify pages or content of pages depicting the element (partially or completely). Other examples of suitable data include the weight of the element, cost of the element and the like.

In addition to the data for the physical instance of the complex system, and perhaps additional data for elements of the complex system, the data integrator 602 may also receive a visual presentation of a 3D model of the complex system, and a layout of pages depicting elements of the plurality of elements of the complex system. The visual presentation of the 3D model may depict elements of the plurality of elements of the complex system. For the 3D model, the visual definition system 600 may include a model viewer 606 coupled to the data integrator. The model viewer may be capable of receiving and interpreting a digital 3D model of the complex system, and configured to produce the visual presentation of at least a portion of the 3D model, which the model viewer may communicate to the data integrator. The model viewer may be configured to produce the visual presentation in accordance with a number of techniques, such as those employed by CAD viewers, virtual reality modeling language (VRML) viewers, X3D viewers, Java 3D viewers, QuickTime virtual reality (YR) or QTVR viewers, integrating vision toolkit (IVT) viewers or the like.

For the layout of pages, the visual definition system 600 may include a layout engine 608, or may be otherwise coupled to a layout engine such as the layout engine 408 of the document layout subsystem 400, which may be coupled to the data integrator 602. The layout engine may be configured to generate a layout of pages depicting elements of the complex system, with the layout including a panoptic arrangement of images of the pages at least some of which include 2D images depicting at least some of the elements. In some examples, the layout engine may be configured to select a layout model and generate a layout of pages, panoptically-arranged, such as in a manner the same as or similar to that explained above.

The layout engine 608 (or layout engine 408 in communication with the visual definition system 600) may be configured to retrieve pages for the complex system from storage 610, where one or more of the pages may be identified according to the associated metadata for one or more other pages (in storage 612), which as explained above, may include information identifying link(s) between pages. The retrieved pages may but need not include pages from system-related documents, at least some but perhaps not all of which may be 2D derivatives of the 3D model of the complex system. In various examples, the retrieved pages may include one or more 2D derivatives of a 3D model of the complex system, and whose associated metadata may include information that reflects the 3D geometry of element(s) of the complex system depicted by the respective 2D derivative(s). In one example, the retrieved pages may further include one or more pages that are not 2D derivatives, or whose metadata is otherwise without information reflecting the 3D geometry of element(s) depicted by the respective page(s).

In a manner similar to that explained above, the layout engine 608 (or layout engine 408) may be configured to generate a layout of the retrieved pages, panoptically-arranged according to the selected layout model, and the retrieved pages and their associated metadata. In one example in which page(s) include sub-images, the layout engine may be configured to identify and retrieve sub-image(s) of page(s) that match or most closely match size(s) specified by the selected layout model and/or associated metadata. The layout engine may be configured to communicate the layout of pages to the data integrator 602.

The data integrator 602 may be configured to integrate the data for the physical instance of the complex system (and perhaps any additional data for elements of the complex system), the visual presentation of the 3D model and layout of pages to produce a visual definition of the complex system. In some examples, this integration may further include additional data for elements of the complex system. The data integrator then may communicate the visual definition such as to a GUI in which the layout may be displayed for user analysis, or a printer for generating a printout including the visual definition.

The visual definition and its components including the data for the physical instance, visual presentation of the 3D model, layout of pages and perhaps additional data for elements of the complex system may be navigated in a number of different manners. In some examples, the visual definition system 600 may further include a navigation engine that may operate in a manner similar to the navigation engine 502 of the document navigation system 500. Or in other examples, the visual definition system 600 may be coupled to a navigation engine such as the navigation engine 502 of the document navigation system 500.

In some examples, the visual presentation of the 3D model and layout of pages in the visual definition may be navigable through interaction with the data. In this regard, the data integrator 602 may be configured to receive a request including selection of an element from the list of the plurality of elements of the data for the physical instance. The data integrator may then communicate with the model viewer 606 to manipulate the visual presentation of the 3D model, or the layout engine 608 to manipulate the layout of pages to draw attention to the element therein. The visual presentation of the 3D model or layout of pages may be manipulated in any of a number of different manners such as to focus on a portion of the visual presentation including the element or apply a visual effect to the element in the visual presentation, and/or focus on or apply a visual effect to one or more pages of the layout that depict the element.

In some examples in which the visual definition includes additional data for elements of the complex system, the additional data in the visual definition may be navigable through interaction with the data, visual presentation or layout. For example, the data integrator 602 may be configured to receive selection of an element of the plurality of elements. In this example, the element may be selectable from each of the list of the plurality of elements, visual presentation of the 3D model and layout of pages. The data integrator may then communicate with the information system 604 to manipulate the additional data in the visual definition to draw attention to additional data for the element.

By integration of the data, visual presentation of the 3D model and layout of pages for the complex system, the data integrator 602 of the visual definition system 600 may produce a visual definition of the complex system for visualization and analysis. In some examples, the data may reflect an as-manufactured configuration of the complex system. The 3D model and layout of pages including 2D images, then, may reflect engineering design data for the aircraft. The visual definition produced by example implementations may then at times provide a complete manufacturing and engineering definition of the aircraft.

The visual definition produced by the data integrator 602 may be beneficial in a number of different contexts, such as in instances in which the complex system has been designed using a hybrid-technique or a combination of both 3D design tools and legacy 2D design tools. In some examples, design of a complex system such as large transport aircraft may result in some of its systems or parts being depicted by the 3D model but not any of the 2D images, or being depicted by at least some of the 2D images but not the 3D model. In some examples, then, the visual presentation of the 3D model may depict one or more elements absent from the pages of the layout. Or the pages of the layout may depict one or more elements absent from the visual presentation of the 3D model.

Figure 7:
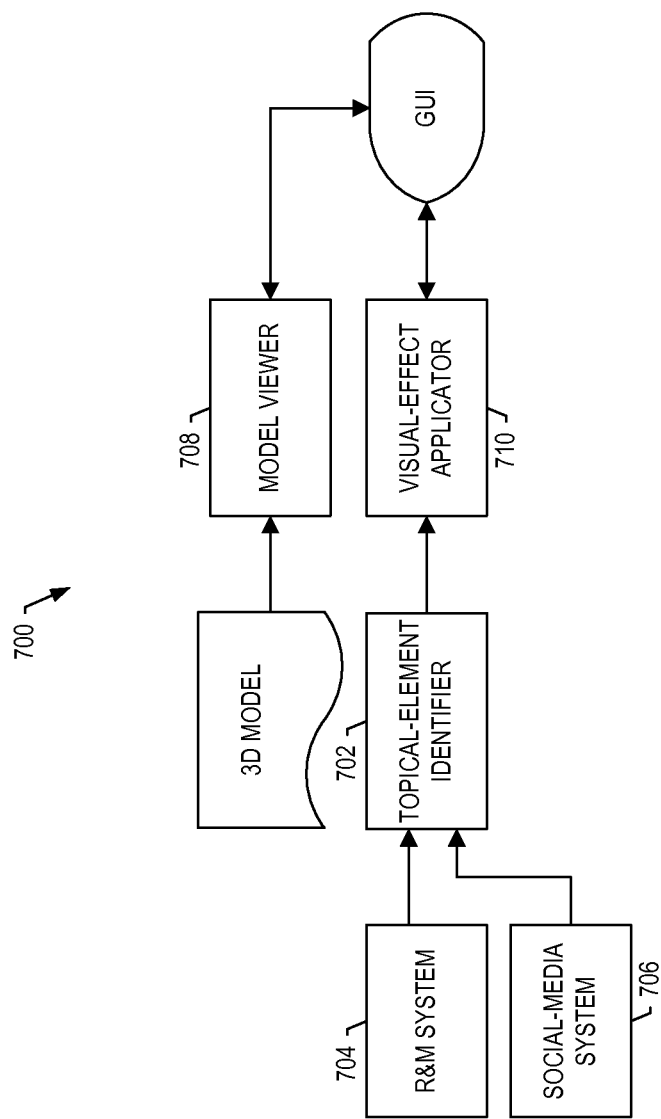
FIG. 7 is an illustration of a topical-element analysis system in accordance with one example implementation.

FIG. 7 illustrates a topical-element analysis system 700 is shown according to one example implementation. The topical-element analysis system may be one example of the topical-element analysis system 112 of the integrated visualization and analysis system 100 of FIG. 1. The topical-element analysis system may be generally configured to identify one or more topical elements of a complex system, and apply a visual effect to those elements depicted by a visual presentation of a 3D model of the complex system to distinguish them from other elements.

As shown, the topical-element analysis system 700 may include a topical-element identifier 702 configured to receive and process data for one or more physical instances of a complex system such as an aircraft composed of a plurality of elements. In this regard, the topical-element identifier may receive and process the data to identify a topical element (one or more topical elements) from the plurality of elements of the complex system. An element of the complex system may be considered topical based on any of a number of different types of data (singularly or in combination) according to which the elements may be identified or compared to one another. For example, the topical element may be an element having or having had an anomalous condition, as indicated by the data for the one or more physical instances of the complex system.

To acquire the data from which to identify the topical element, the topical-element identifier 702 may be coupled to any of a number of different computer-based information systems. As shown, for example, the topical-element identifier may be coupled to a computer-based system 704 configured to collect reliability and maintainability (R&M) data, and from which the topical-element identifier may receive and process performance-based metrics for elements of the complex system. The topical-element identifier may then identify the topical element from a value of a performance-based metric, such as an element having a value above a certain threshold. Examples of suitable performance-based metrics may include quantitative values of maintainability (e.g., measure of the ability of an element undergoing maintenance to retain or be restored to a particular condition), reliability (e.g., probability that an element will perform its intended function) or the like. Other examples of suitable performance-based metrics include the mean times between various events such as failure, maintenance, repair, critical failure or the like.

As also shown, for example, the topical-element identifier 702 may be coupled to a computer-based system 706 configured to collect social media data in accordance with any of a number of different social media technologies, such as Internet forums, weblogs, social blogs, microblogging, wikis, social networks and the like. The topical-element identifier may receive and process user-generated content. The social media data may include items of user-generated content such as posts, entries or the like from users who have access to the computer-based system or another system from which the computer-based system collects social media data. In some examples, then, the topical-element identifier may identify the topical element from a number of distinct items of user-generated content that references or otherwise identifies the topical element.

In addition to the topical-element identifier 702, the topical-element analysis system 700 may include a model viewer 708 capable of receiving and interpreting a digital 3D model of the complex system, and configured to produce a visual presentation of at least a portion of the 3D model such as in a suitable GUI, This model viewer may be the same as or similar to the model viewer 604 of the visual definition system 600.

The visual presentation may depict the topical element and one or more other elements of the plurality of elements, with the elements being depicted by their corresponding 3D objects of the 3D model. And the topical-element analysis system 700 may include a visual-effect applicator 710 coupled to the topical-element identifier 702, and configured to apply a visual effect to the topical element depicted by the visual presentation to distinguish the topical element from the other element(s) depicted by the visual presentation. The visual effect may be any of a number of different effects. Examples of suitable visual effects include an opaque or translucent outline of a noticeable color around the 3D object that corresponds to the topical element, or an opaque or translucent fill of a noticeable color applied to the entire 3D object for the topical element. The interested element(s) may be keyed to their 3D objects in any of a number of different manners, such as by identifiers (e.g., part numbers) of the interested element(s).

In various instances, it may be desirable to convey additional information in the visual effect applied to the topical element, such as may reflect a level of interest in the topical element. This may be particularly beneficial in instances in which multiple topical elements are identified for application of visual effects. In some examples, then, the topical-element identifier 702 may also be configured to calculate a level-of-interest value for the topical element. In these examples, the visual effect applied to the topical element may have a property that varies with the level of interest value in a predefined range of values. In the case of a colored outline or fill, for example, one or more properties of the color such as its hue, value and/or intensity may vary with the calculated level of interest value.

In one particular example, the topical-element identifier 702 may scale the value of a performance-based metric to within a range of 0.00 to 1.00, and then multiply the scaled value by 255 to calculate a level-of-interest value. In another particular example, the level of interest may be based on a count system, such as in a manner suggested above for the number of distinct items of user-generated content that references or otherwise identifies the topical element. Similar to the above example, this number may be scaled to within 0.00 and 1.00 and multiplied by 255 to calculate the level-of-interest value. For an RGB color model in which colors are produced from red, green and blue color components, the level-of-interest value may correspond to the intensity value of a particular one of the components (e.g., red), with the intensity values of the other components (e.g., green, blue) set to zero. This may result in a gradient between black and the particular color component, and in one example in which the performance-based metric relates to reliability, the color's intensity may be interpreted in a range from black being a 100% reliable part to red being a part with no reliability.

The visual presentation of the 3D model with the applied visual effect may be navigated in a number of different manners, such as in the same or similar manners described above with respect to the document navigation system 108, 500. These navigation options may include horizontal movement or panning the 3D model, as well as zooming into the 3D model, in both instances the visual effect following the topical element through the navigation. In addition, the navigation options may include vertical movement through the 3D model, or movement perpendicular to that of the pan, which may have the appearance of a "fly through" of the complex system. Here again, the visual effect may follow topical element to which it has been applied.

The visual presentation and applied visual effect of this aspect of example implementations may enable performance of analytics such as by determining one or more hot spots on the complex system. Locations or elements of particular topical interest may be easier to see in a visual manner than attempting to visualize them in a textual report. This capability may enable an analyst to easily recognize patterns, trends and significant issues. Seeing the visual effect applied to the visual presentation of a 3D model with appropriate surrounding 3D context may enable the analyst to more easily recognize even subtle logical connections between pieces of information that may not otherwise be obvious. This capability may enhance the analyst's ability to use information and intelligence for trouble-shooting problems, recognizing opportunities for making product improvements, improving product safety and the like.

Figure 8:
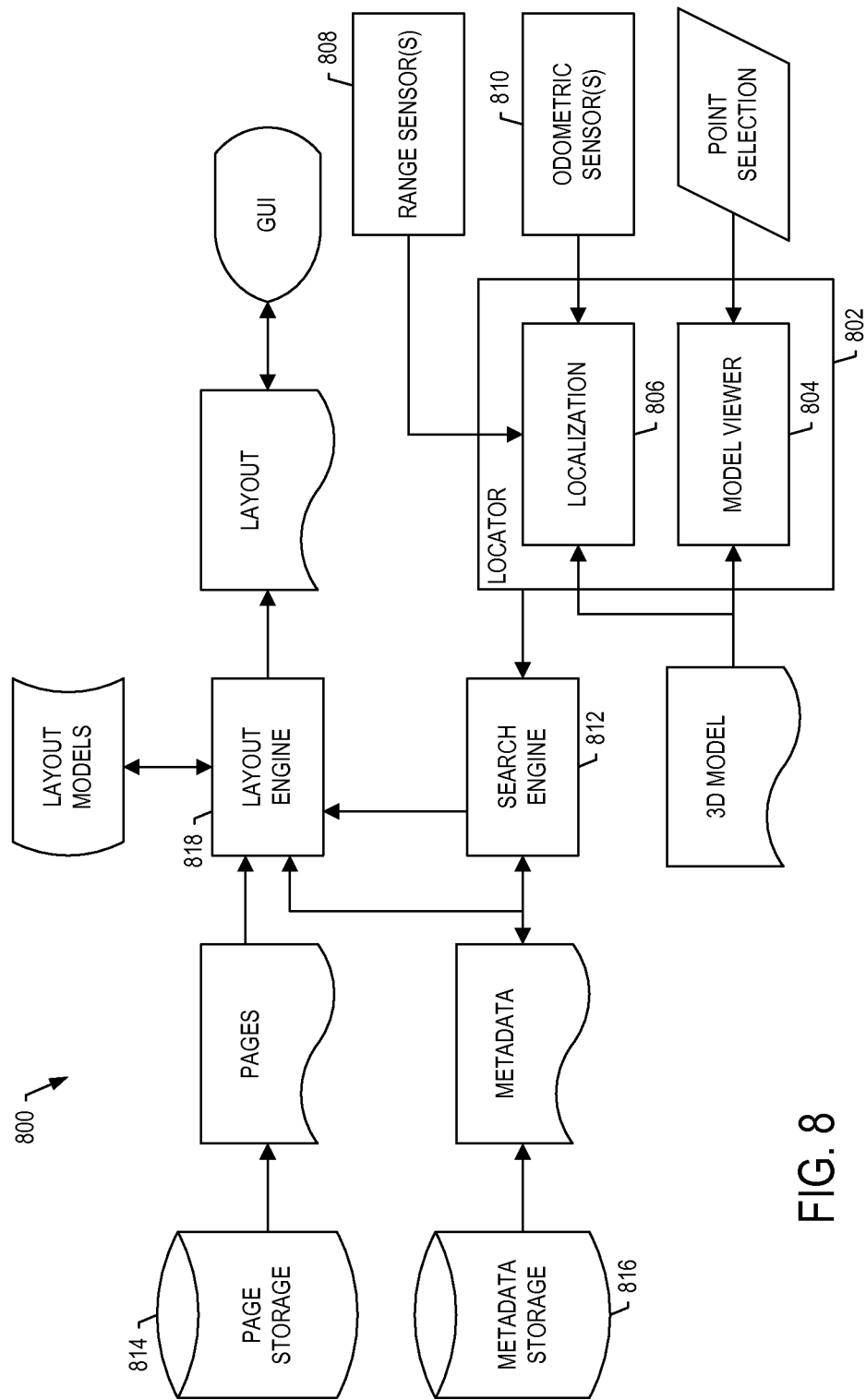
FIG. 8 is an illustration of a panoptic visualization spatial-based search system in accordance with one example implementation.

Turning to FIG. 8, a spatial-based search system 800 is shown according to one example implementation. The spatial-based search system may be one example of the spatial-based search system 114 of the integrated visualization and analysis system 100 of FIG. 1. The spatial-based search system may be generally configured to perform spatial-based searches for pages of a panoptic visualization document collection, such as the collection from the document collection system 102 (e.g., document collection system 200). Additionally or alternatively, for example, it may include the collection of which the document layout system 106 (e.g., document layout system 490) generates a layout; and/or it may include the collection, a layout of which the document navigation system 108 (e.g., document navigation system 500) selects and provides navigation options.

As indicated above, the spatial-based search may be for pages depicting elements of a complex system at a particular location or within (partially or completely) a volume about or defined by one or more particular locations within the coordinate system of the complex system. The spatial-based search system 800 may therefore include a locator 802 configured to receive or calculate such a particular location. The locator may be configured to receive or calculate the particular location in any of a number of different manners. Examples of suitable techniques are disclosed in U.S. Pat. No. 7,859,655, entitled: Method Involving a Pointing Instrument and a Target Object, issued on Dec. 28, 2010, U.S. Pat. No. 7,873,494, entitled: Method and Apparatus for an Aircraft Location Position System, issued on Jan. 18, 2011, and U.S. Pat. No. 8,044,991, entitled: Local Positioning System and Method, issued on Oct. 25, 2011, the contents of all of which are incorporated herein by reference in their entireties.

In one example, the locator 802 may receive a particular location from a user, such as through an appropriate GUI including a textual entry field or other user-interface control for receiving the location. In some examples, the locator may include a model viewer 804 capable of interpreting the 3D model of the complex system and configured to produce a visual presentation of the 3D model such as in a suitable GUI. This model viewer may be the same as or similar to the model viewer 604, 708 of the visual definition system 600 or topical-element analysis system 700, and in some examples, the GUI may include the visual presentation with visual effect applied by the topical-element analysis system. The model viewer may be configured to receive user-selection of a particular point on the visual presentation of the 3D model, and map or otherwise translate the particular point to a particular location on the complex system. In one example, this may be accomplished using the 3D model and its associated information.

In addition to or in lieu of the model viewer 804, in one example, the locator 802 may include a localization module 806 coupled to one or more range sensors 808 and/or odometric sensors 810. The range sensor(s) may be configured to provide range measurements between the sensor(s) at an origin in a second coordinate system (at times herein referred to as a "local" coordinate system), and a plurality of points at respective locations on a physical instance of the complex system. The odometric sensor(s) may be housed with or proximate the range sensor(s), and may be configured to provide odometry data. Examples of suitable range sensors include laser rangefinders, LiDAR (Light Detection and Ranging) sensors, sonar sensors, camera or other visual sensors, or the like. The odometric sensors may be of any of a number of different types of sensors, and may include not only odometric sensors but visual-odometric sensors, inertial measurement units (IMUs), accelerometers, gyroscopes or the like.

The points on the physical instance of the complex system for which the range sensor(s) 808 provide range measurements may include points at known locations within the coordinate system of the complex system (at times herein referred to as a "global" coordinate system), and a particular point at an unknown, particular location within the global coordinate system. In one example, the known locations may be taken from the 3D model of the respective complex system. The localization module 706 may therefore be configured to receive and process the range measurements and odometry data to calculate the unknown, particular location within the global coordinate system. Examples of suitable techniques are shown and described in greater detail in at least the aforementioned '937 and '994 applications.

Regardless of the exact manner by which the locator 802 receives or calculates the particular location within the global coordinate system of the complex system, the locator may communicate the particular location to a search engine 812 as a spatial-based request for pages of a panoptic visualization document collection. Similar to the above, the panoptic visualization document collection may have pages each of which includes respective media content and has associated metadata. The pages and metadata may be stored in respective storage 814, 816, which in one example may correspond to respective storage 404, 406 shown in FIG. 4.

In response to the request, the search engine 812 may be configured to identify one or more pages depicting elements of the complex system at the particular location or within (partially or completely) a volume. In various examples, the volume may be a volume about the particular location, which may be preset, user-specified or the like. In other examples, the locator 802 may receive or calculate multiple particular locations within the global coordinate system of the complex system, which may be communicated to the search engine. In these examples, the multiple particular locations may define the volume for which the search engine may identify page(s) depicting elements of the complex system.

The search engine 812 may be configured to identify page(s) in a number of different manners, such as based on the associated metadata of the pages of the collection. As explained above, the metadata of various pages may include for element(s) that they depict, information that reflects the 3D geometry of the element within the coordinate system of the complex system, such as its a spatial location, volume extent, center of mass (or gravity) or the like. In one example, then, the search engine may identify page(s) depicting element(s) whose volume extent includes the particular location or is partially or completely within the volume about or defined by particular location(s). In other examples, the search engine may identify page(s) depicting element(s) having a point (e.g., vertex) or center of mass/gravity at the particular location or within the volume about or defined by particular location(s).

Similar to the visual definition system 600, the spatial-based search system 800 may include a layout engine 818, or may be otherwise coupled to a layout engine such as the layout engine 408 of the document layout subsystem 400. Or in some examples, the spatial-based search system may instead be coupled to the layout engine 606 of the visual definition system. In any event, the layout engine may be configured to select a layout model and generate a layout of pages, panoptically-arranged, such as in a manner the same as or similar to that explained above. \

The layout engine 818 (or layout engine 408, 606 in communication with the spatial-based search system 800) may be configured to retrieve (from storage 814) the identified page(s) and perhaps other page(s) identified according to the associated metadata for the identified page. Similar to before, these pages may but need not include pages from system-related documents. In some examples, one or more of the pages may be 2D derivatives of the 3D model, although the pages may include 2D images not derived from the 3D model. That is, in some examples, the retrieved pages may include one or more 2D derivatives of a 3D model of the complex system (with metadata reflecting the 3D geometry of the depicted elements), and/or perhaps one or more pages that are not 2D derivatives (without metadata reflecting the 3D geometry of the depicted elements).

In a manner similar to that explained above, the layout engine 818 (or layout engine 408, 606) may be configured to generate a layout of the retrieved pages, panoptically-arranged according to the selected layout model, and the retrieved pages and their associated metadata. In one example in which page(s) include sub-images, the layout engine may be configured to identify and retrieve sub-image(s) of page(s) that match or most closely match size(s) specified by the selected layout model and/or associated metadata. The layout engine may be configured to communicate the layout of pages such as to a GUI in which the layout may be displayed, or a printer for generating a printout including the layout.

In one example, the spatial-based search system 800 may further include a navigation engine, or may be otherwise coupled to a navigation engine such as the navigation engine 502 of the document navigation system 500. In this example, the respective navigation engine may be configured to select one or more navigation options from a plurality of navigation options for navigating the layout generated by the layout engine 818 (or layout engine 408, 606). The navigation options may be selected in a number of different manners, such as in a manner the same as or similar to that explained above. The navigation engine may then be configured to communicate the selected navigation options, such as to a GUI in which the selected navigation options may be presented along with the layout. The navigation engine may also be configured to receive a request according to one or more of the selected navigation options, effect adjustment of the layout in response and according to the request, and communicate the adjustment. In this example, the navigation engine may receive the request directly or via a suitable request interface (e.g., request interface 504).

Figure 11:
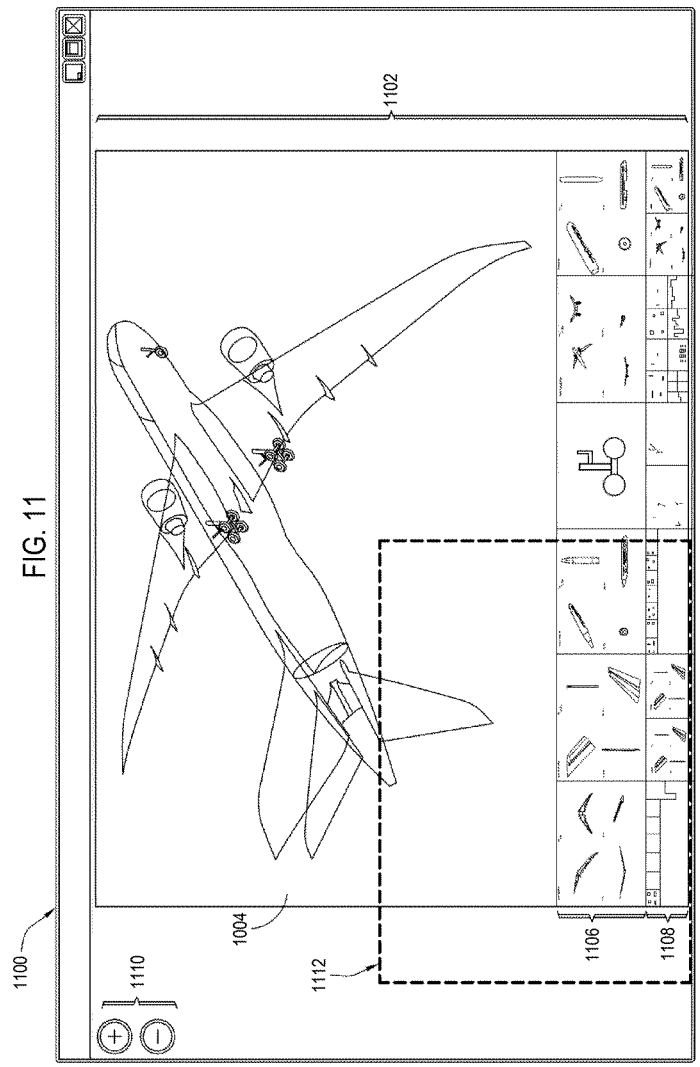
Figure 12:
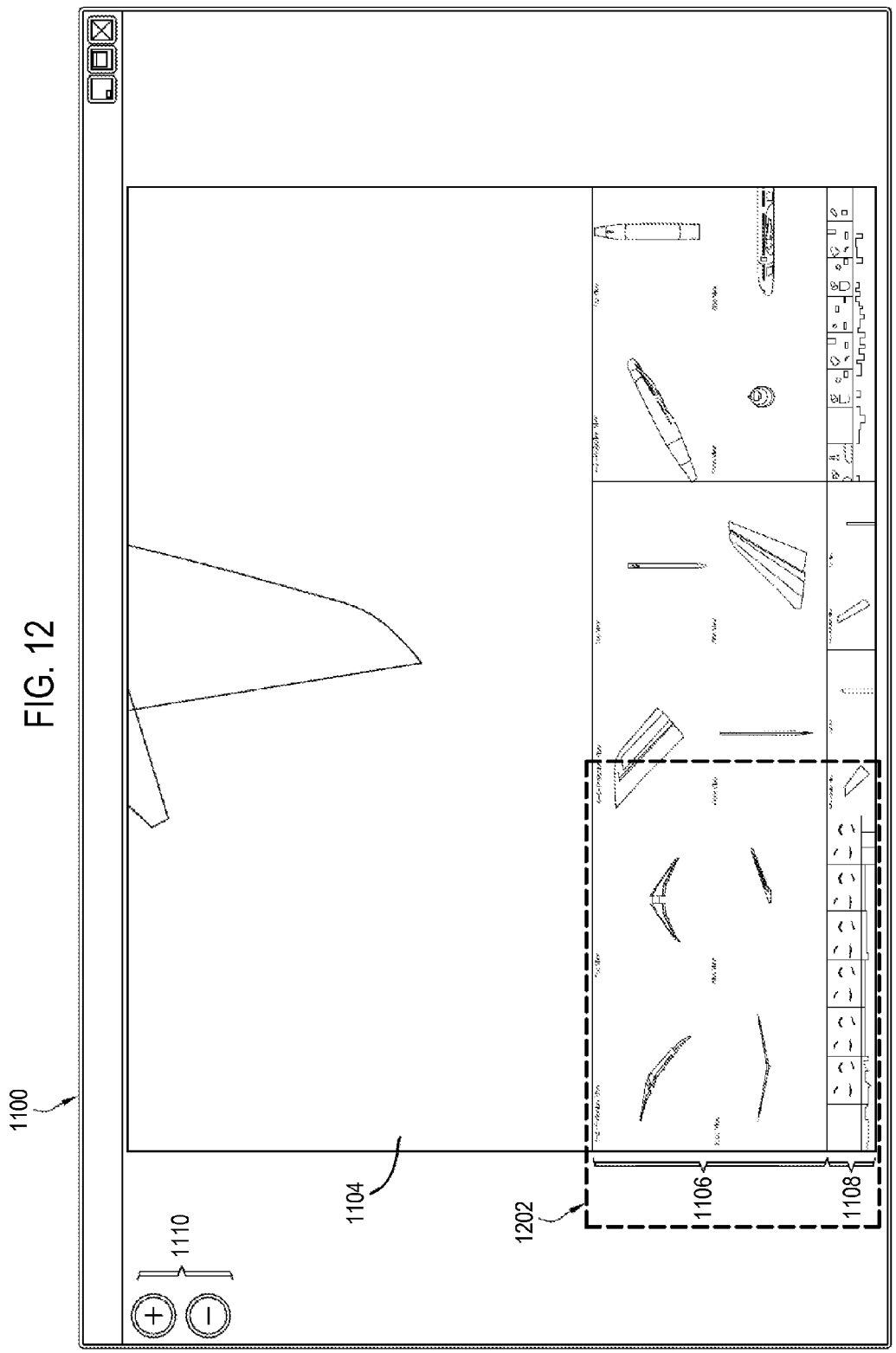
Figure 13:
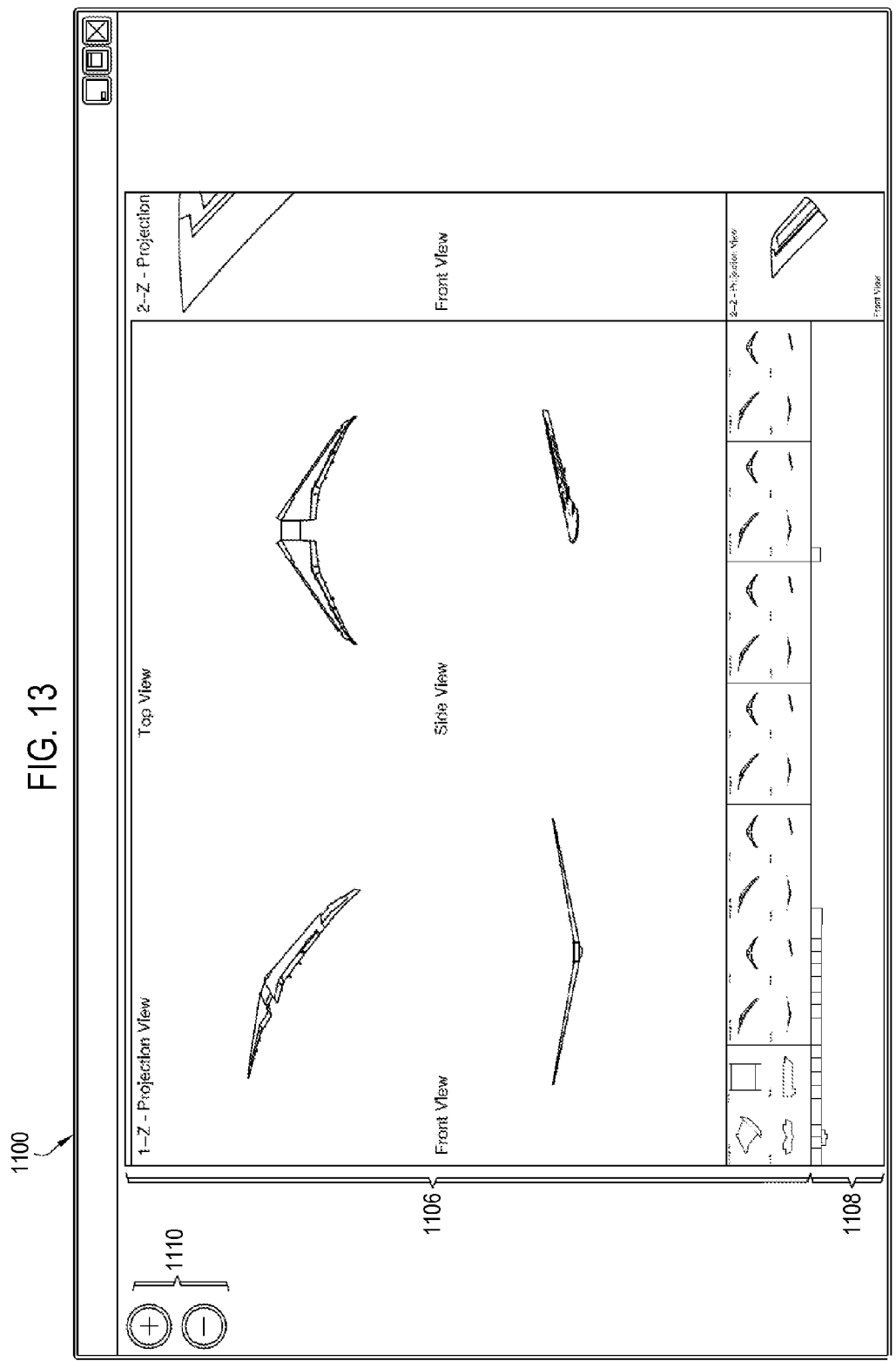

To even further illustrate example implementation of the present disclosure, reference will now be made to FIGS. 11-13, which depict example layouts of pages that may be displayed in a GUI that has a predetermined viewable area, and which may be navigated by a user, according to an example implementation of the present disclosure. FIGS. 11-13 illustrate an example of a layout according to the hierarchy layout model 900 displayed in a GUI that has a predetermined viewable area 1100. As shown, a layout according to the hierarchy layout model may include a plurality of pages 1102, each of which in one example may be a sub-image of the page at a respective resolution. Various ones of the pages may have different resolutions in the layout, with page 1104 having a higher resolution than pages 1106, which in turn have a higher resolution than pages 1108, some of which again in turn have a higher resolution than others of which tower in the hierarchy.

The pages may be located and/or sized in the layout according to logical relationship(s) between the pages. In the example shown, the pages 1102 are primarily from 2D derivatives of a 3D model of an aircraft but they may also include one or more other pages not produced from the 3D model, and may have object-subject relationships. More particularly, for example, object(s) of a page on a level of the hierarchy may be subject(s) of pages below it in the hierarchy, the subject(s) in one example being additional detail regarding the object(s).

More particularly, fir example, page 1104 may depict a projection view of an exterior of the entire aircraft. Pages 1106 may depict respective ones of a wing and wing box, tail, fuselage, landing gear, engine, and door assemblies. In the illustrated example, the pages 1106 depicting the wing and wing box, tail, fuselage, engine, and door assemblies may be from 2D derivatives of the 3D model, while the page 1106 depicting the landing gear may not be produced from the 3D model. Pages 1108 may depict additional detail about the element(s) depicted by respective ones of pages 1106. Each of pages 1106 (except that of the landing gear), 1108 may depict four views of a respective element, such as a projection view, front view, top view and side (left or right) view. In the viewable area 1100, however, pages 1108 (and perhaps even pages 1106) may be presented at a resolution that causes their media content to be only partially understood or not understood at all by a user. Of course, in other example implementations, pages 1108 may be presented at a sufficient resolution to interpret substantially all of their media content.

The GUI may present one or more selected navigation options for navigating the layout of pages 1102. In this illustrative example, pan and zoom navigation options may be presented in the form of controls 1110 to move and/or increase the size of the pages in the viewable area 1100 to focus on a portion 1112 of the layout. In other words, the user may activate the aforementioned controls to move and/or zoom the layout to fill a greater portion of the viewable area of the GUI with a portion of the layout. FIG. 12 illustrates one example of the result of navigating the layout in this manner.

As shown in FIG. 12, as the user activates controls 1110 to focus on the portion 1112 of the layout, the size of pages 1104-1108 may increase which, in one example, may include replacing sub-images of pages 1104-1106 with corresponding sub-images at higher resolutions. The resolution of the sub-images may allow the user to interpret substantially all of the presented media content. In this view, however, pages 1108 may not be presented with sufficient resolution to be interpreted by the user, because the size of the respective pages may not have been increased to a level implicating a next sub-image. That is, even after having increased the size of the image, the size may still most closely approximate the same sub-image so as to not cause its replacement with the next sub-image at a higher resolution. In one example in which only a portion of page 1104 is within the viewable area of the GUI, and in which the respective page is divided into tiles, only those tiles covering the viewable portion of the respective page may be retrieved and displayed.

In one example, the user may again activate controls 1110 to move and/or resize the view to focus on an even smaller portion 1202 of the layout, as shown for example in FIG. 113. Similar to before, as the user activates the controls 1110 to focus on the portion 1202 of the layout, the size of pages 1104-1108 may increase, which in one example, may now further include replacing a sub-image of page 1108 with a corresponding sub-image at a higher resolution.

Figure 14:
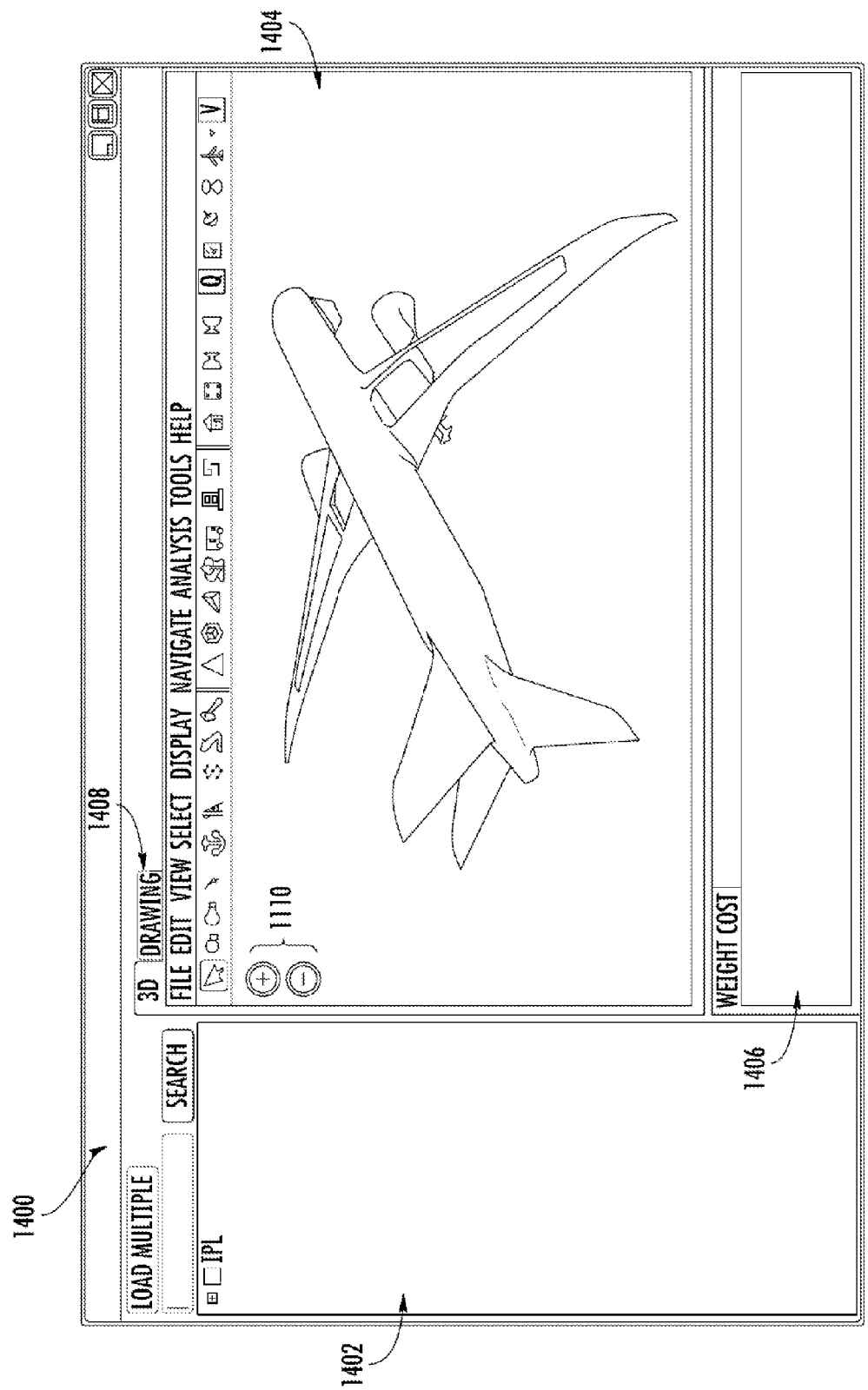

FIG. 14 illustrates an example of a GUI that has a predetermined viewable area 1400 in which at least a portion of a visual definition of an aircraft is displayed. As shown, the viewable area may be divided into a plurality of portions, frames or the like in which information-based components of the visual definition may be displayed. For example, the viewable area may include a first portion 1402 in which data for a physical instance of the aircraft may be displayed. As shown, for example, this data may include a list of parts from an indentured parts list. The viewable area may include a second portion 1404 in which either or both of the visual presentation of a 3D model of the aircraft, or a layout of pages depicting elements of the aircraft may be displayed, and a third portion 1406 in which additional data for elements of the aircraft may be displayed. As shown, the second portion is displaying a visual presentation of the 3D model of the aircraft, and the third portion is displaying the weight and cost of various elements of the aircraft. Similar to the GUI shown in FIGS. 11-13, the GUI of FIG. 14 may include various navigation options at least some of which may be presented in the form of controls 1110.

For display of the layout of pages, in one example, the GUI may include a tab 1408 or other similar control from which the visual presentation of the 3D model (identified as "3D") or layout of pages (identified as "Drawing") may be selectively displayed in the second portion 1404. In another example, the GUI may include a control from which the layout of pages may be brought up in a separate (e.g., pop-up) window. The visual presentation of the 3D model is shown in the second portion, although selection of the appropriate tab or other control element may bring up the layout of pages, which may be displayed in a manner such as that shown and described with respect to FIGS. 11-13.

As shown in FIG. 14, for example, selection of an element in the first portion 1402 may cause the visualization and analysis system 100 to zoom to and highlight (apply a visual effect) the selected element in the visual presentation of the 3D model in the second portion 1404. In addition, selection of the element may cause the visualization and analysis system to display additional data for the selected element in the third portion 1406. Similarly, selection of a 3D object in the visual presentation of the 3D model in the second portion may cause the visualization and analysis system to focus on the corresponding, and thus selected element corresponding to the 3D object in the first portion, and/or display additional data for the selected element in the third portion. The layout of pages for elements of the complex system may be navigated in a manner similar to that for the visual presentation of the 3D model.

Figure 15:
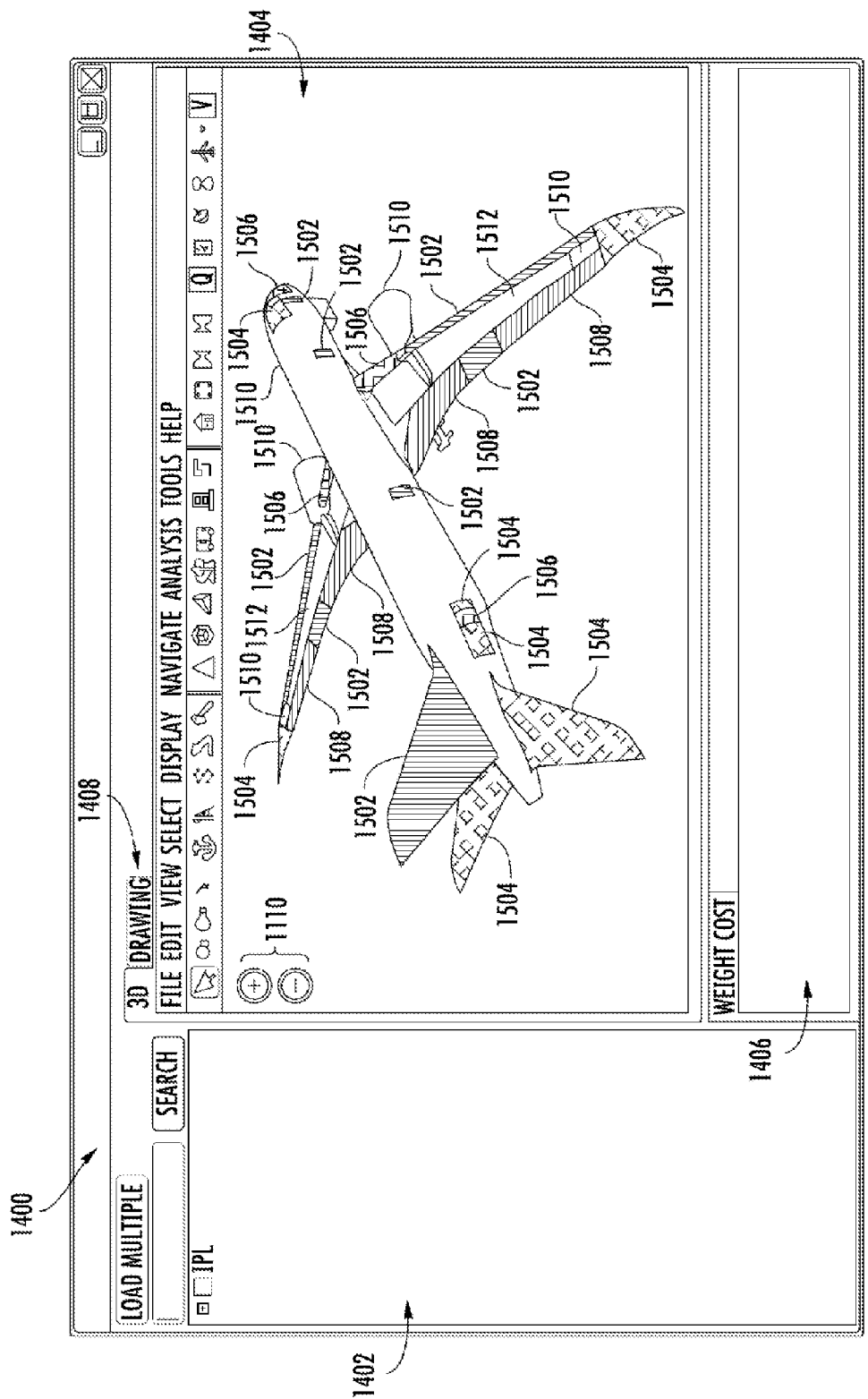
Figure 16:
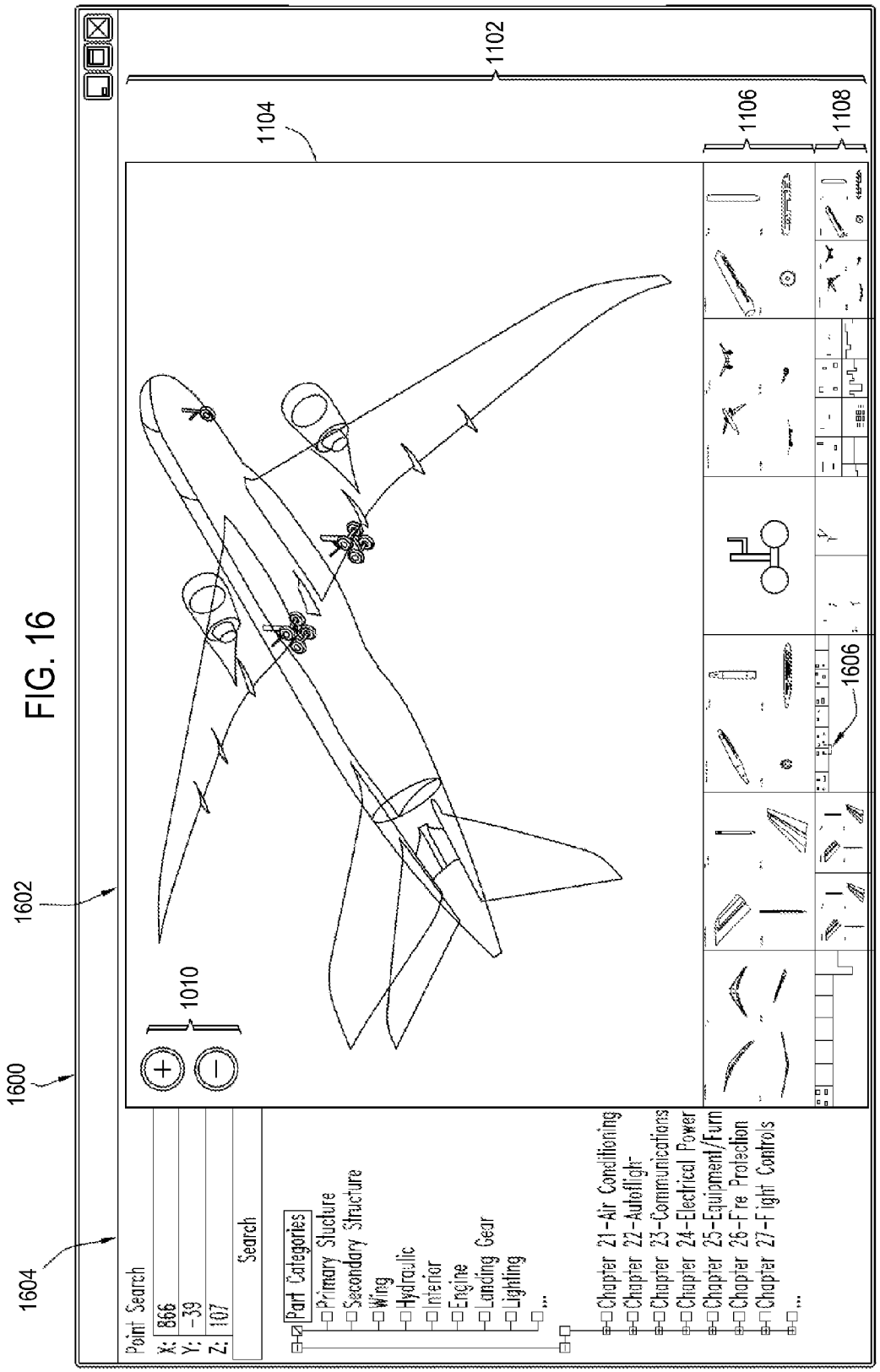

FIG. 15 continues the example of FIG. 14, and in which color may be applied to some of the elements of the aircraft identified as being topical, and in which the hue or some other property of the color may be varied with a calculated level-of-interest value for the respective topical elements. In the illustrated example, the elements identified as topical may be those for which at least a certain number of issues have been identified, as reflected by data from a number of different sources of data (e.g., social-media system 706). The level-of-interest value here may be proportionate to the number of identified issues.

As shown in FIG. 15, for example, topical elements 1502 to which a first color (e.g., red) has been applied may reflect elements with the largest number of identified issues. The hue of the color may then transition it from the first to a second color (e.g., dark orange) for some other topical elements 1504, and then a third color (e.g., yellow) for even further topical elements 1506 to reflect elements with fewer numbers of identified issues. The hue may continue to transition to yet a fourth color (e.g., blue) for yet other topical elements 1508 to reflect elements with even fewer numbers of identified issues, and a fifth color (e.g., gray) for topical elements 1510 with yet fewer numbers of identified issues. And the remaining elements 1512, including those without any identified issues or with less than the certain number of identified issues, may be included in the visual presentation in white or without any applied color.

FIGS. 16 and 17 again present the example layout shown in FIGS. 11-13 but in a further example in which the layout is presented along with fields or controls for performing a search for elements of the aircraft, such as by a spatial-based search. In this example, the GUI may divide its overall viewable area 1600 into a plurality of panes for presenting respective information. One of the panes may be or otherwise include the viewable area 1602 similar to viewable area 1100 for presenting a layout of pages, similar to that described above with respect to FIGS. 11-13. The GUI may also include a pane 1604 for browsing elements of the aircraft, such as through metadata associated with pages depicting such elements. From this pane, elements of the aircraft may be browsed or otherwise searched for desired elements such as by part categories, Air Transport Association (ATA) chapter numbers or the like. Additionally, or alternatively, for example, the GUI may include in this pane a textual entry field for receiving a location for performing a spatial-based search for elements of the aircraft at the respective location, or within (partially or completely) a volume about the respective location.

A user may enter a particular location (e.g., 866, −39, 107) in the textual entry field of pane 1604, which may initiate a search for pages of the layout depicting element(s) of the aircraft at the particular location or within a volume about the particular location. In one example, the document navigation system 108 may apply one or more visual effects to these page(s) to draw the user's attention to them, such as by use of the aforementioned cue option. In other examples, the navigation system could rearrange the layout to only show those page(s), or dim or turn the non-relevant page(s) semi-transparent. In the illustrated examples, the search results may include pages in a portion 1606 of the layout, and a user may activate controls 1110 to focus on the respective portion. FIG. 17 illustrates one example of the result of navigating the layout in this manner, and in which borders may be applied around respective pages 1702 of the search results.

According to example implementations of the present disclosure, the integrated visualization and analysis system 100 and its subsystems including the document collection system 102, 3D model collection system 104, document layout system 106, document navigation system 108, visual definition system 110, topical-element analysis system 112 and spatial-based search system 114 may be implemented by various means. Similarly, the examples of a document collection system 200, 3D model collection system 300, document layout system 400, document navigation system 500, visual definition system 600, topical-element analysis system 700 and spatial-based search system 800, including each of their respective elements, may be implemented by various means according to example implementations. Means for implementing the systems, subsystems and their respective elements may include hardware, alone or under direction of one or more computer program code instructions, program instructions or executable computer-readable program code instructions from a computer-readable storage medium.

In one example, one or more apparatuses may be provided that are configured to function as or otherwise implement the systems, subsystems and respective elements shown and described herein. In examples involving more than one apparatus, the respective apparatuses may be connected to or otherwise in communication with one another in a number of different manners, such as directly or indirectly via a wireline or wireless network or the like.

Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor (e.g., processor unit) connected to a memory (e.g., storage device).

The processor is generally any piece of hardware that is capable of processing information such as, for example, data, computer-readable program code, instructions or the like (generally "computer programs," e.g., software, firmware, etc.), and/or other suitable electronic information. More particularly, for example, the processor may be configured to execute computer programs, which may be stored onboard the processor or otherwise stored in the memory (of the same or another apparatus). The processor may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory is generally any piece of hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wireline and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid display (LCD), light-emitting diode display (LED), plasma display panel (PDP) or the like. The user input interfaces may be wireline or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

Many modifications and other implementations of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for implementation of a system for integrated visualization and analysis of a complex system, the apparatus comprising a processor and a memory storing executable instructions that in response to execution by the processor cause the apparatus to at least:

receive data for a physical instance of a complex system composed of a plurality of elements, the data including a list of the plurality of elements that reflects a relationship between at least some of the plurality of elements;

generate a visual presentation of a digital three-dimensional (3D) model of the complex system, the visual presentation depicting elements of the plurality of elements;

generate a layout of document components depicting elements of the plurality of elements, the layout including a panoptic arrangement of images of the document components at least some of which include two-dimensional (2D) images depicting at least some of the elements, the panoptic arrangement being two-dimensional and the relationship between at least some of the plurality of elements being expressed in the panoptic arrangement by a difference in size or depth of at least some of the 2D images relative to others of the 2D images; and integrate the data, visual presentation of the 3D model and layout of document components to produce a visual definition of the complex system, wherein at least the visual presentation and layout in the visual definition are navigable through interaction with the data.

2. The apparatus of claim 1, wherein the visual presentation of the 3D model depicts one or more elements absent from the document components of the layout, or the document components of the layout depict one or more elements absent from the visual presentation of the 3D model.

3. The apparatus of claim 1, wherein the memory stores further executable instructions that in response to execution by the processor cause the apparatus to further navigate the visual presentation of the 3D model or layout of document components, including the apparatus being caused to at least:

receive selection of an element from the list of the plurality of elements; and manipulate the visual presentation of the 3D model or layout of document components in the visual definition to draw attention to the element therein, including being caused to at least one of focus on a portion of the visual presentation including the element or apply a visual effect to the element, or focus on or apply a visual effect to one or more document components of the layout that depict the element.

4. The apparatus of claim 1, wherein the memory stores further executable instructions that in response to execution by the processor cause the apparatus to further receive additional data for elements of the plurality of elements, wherein the apparatus being caused to integrate the data, visual presentation of the 3D model and layout of document components further includes the additional data, the additional data in the visual definition being navigable through interaction with the data, visual presentation or layout.

5. The apparatus of claim 4, wherein the memory stores further executable instructions that in response to execution by the processor cause the apparatus to further navigate the additional data, including the apparatus being caused to at least:

receive selection of an element of the plurality of elements, the element being selectable from each of the list of the plurality of elements, visual presentation of the 3D model and layout of document components; and manipulate the additional data in the visual definition to draw attention to additional data for the element.

6. The apparatus of claim 1, wherein the memory stores further executable instructions that in response to execution by the processor cause the apparatus to further at least:

receive and process additional data for the physical instance of the complex system, the additional data being received and processed to identify a topical element from the plurality of elements, the elements depicted by the visual presentation of the 3D model including the topical element and one or more other elements of the plurality of elements; and apply a visual effect to the topical element depicted by the visual presentation to distinguish the topical element from the one or more other elements depicted by the visual presentation.

7. The apparatus of claim 1, wherein the memory stores further executable instructions that in response to execution by the processor cause the apparatus to further at least:

receive user-selection of a particular point on the visual presentation of the 3D model in the visual definition of the complex system; and translate the particular point to a particular location within a coordinate system of the complex system, and wherein the apparatus being caused to generate the layout of document components includes being caused to at least:

identify a first document component that depicts an element of the complex system at the particular location or within a volume about or at least in part defined by the particular location, the first document component having and being identified from associated metadata that provides structured information reflecting a 3D geometry of the element within the coordinate system of the complex system; and generate the layout of document components including the first document component, and including one or more second document components identified from the associated metadata that provides structured information further identifying a link between the first document component and one or more second document components.

8. A method comprising:

receiving data for a physical instance of a complex system composed of a plurality of elements, the data including a list of the plurality of elements that reflects a relationship between at least some of the plurality of elements;

generating a visual presentation of a digital three-dimensional (3D) model of the complex system, the visual presentation depicting elements of the plurality of elements;

generating a layout of document components depicting elements of the plurality of elements, the layout including a panoptic arrangement of images of the document components at least some of which include two-dimensional (2D) images depicting at least some of the elements, the panoptic arrangement being two-dimensional and the relationship between at least some of the plurality of elements being expressed in the panoptic arrangement by a difference in size or depth of at least some of the 2D images relative to others of the 2D images; and integrating the data, visual presentation of the 3D model and layout of document components to produce a visual definition of the complex system, wherein at least the visual presentation and layout in the visual definition are navigable through interaction with the data.

9. The method of claim 8, wherein the visual presentation of the 3D model depicts one or more elements absent from the document components of the layout, or the document components of the layout depict one or more elements absent from the visual presentation of the 3D model.

10. The method of claim 8 further comprising navigating the visual presentation of the 3D model or layout of document components, including:

receiving selection of an element from the list of the plurality of elements; and manipulating the visual presentation of the 3D model or layout of document components in the visual definition to draw attention to the element therein, including at least one of focusing on a portion of the visual presentation including the element or applying a visual effect to the element, or focusing on or applying a visual effect to one or more document components of the layout that depict the element.

11. The method of claim 8 further comprising receiving additional data for elements of the plurality of elements, wherein integrating the data, visual presentation of the 3D model and layout of document components further includes the additional data, the additional data in the visual definition being navigable through interaction with the data, visual presentation or layout.

12. The method of claim 11 further comprising navigating the additional data, including:

receiving selection of an element of the plurality of elements, the element being selectable from each of the list of the plurality of elements, visual presentation of the 3D model and layout of document components; and manipulating the additional data in the visual definition to draw attention to additional data for the element.

13. The method of claim 8 further comprising:

receiving and processing additional data for the physical instance of the complex system, the additional data being received and processed to identify a topical element from the plurality of elements, the elements depicted by the visual presentation of the 3D model including the topical element and one or more other elements of the plurality of elements; and applying a visual effect to the topical element depicted by the visual presentation to distinguish the topical element from the one or more other elements depicted by the visual presentation.

14. The method of claim 8 further comprising:

receiving user-selection of a particular point on the visual presentation of the 3D model in the visual definition of the complex system; and translating the particular point to a particular location within a coordinate system of the complex system, and wherein generating the layout of document components comprises:

identifying a first document component that depicts an element of the complex system at the particular location or within a volume about or at least in part defined by the particular location, the first document component having and being identified from associated metadata that provides structured information reflecting a 3D geometry of the element within the coordinate system of the complex system; and generating the layout of document components including the first document component, and including one or more second document components identified from the associated metadata that provides structured information further identifying a link between the first document component and one or more second document components.

15. A computer-readable storage medium that is non-transitory and has computer-readable program code portions stored therein that, in response to execution by a processor, cause an apparatus to at least:

receive data for a physical instance of a complex system composed of a plurality of elements, the data including a list of the plurality of elements that reflects a relationship between at least some of the plurality of elements;

generate a visual presentation of a digital three-dimensional (3D) model of the complex system, the visual presentation depicting elements of the plurality of elements;

generate a layout of document components depicting elements of the plurality of elements, the layout including a panoptic arrangement of images of the document components at least some of which include two-dimensional (2D) images depicting at least some of the elements, the panoptic arrangement being two-dimensional and the relationship between at least some of the plurality of elements being expressed in the panoptic arrangement by a difference in size or depth of at least some of the 2D images relative to others of the 2D images; and integrate the data, visual presentation of the 3D model and layout of document components to produce a visual definition of the complex system, wherein at least the visual presentation and layout in the visual definition are navigable through interaction with the data.

16. The computer-readable storage medium of claim 15, wherein the visual presentation of the 3D model depicts one or more elements absent from the document components of the layout, or the document components of the layout depict one or more elements absent from the visual presentation of the 3D model.

17. The computer-readable storage medium of claim 15 having further readable program code portions stored therein that, in response to execution by the processor, cause the apparatus to further navigate the visual presentation of the 3D model or layout of document components, including the apparatus being caused to at least:

receive selection of an element from the list of the plurality of elements; and manipulate the visual presentation of the 3D model or layout of document components in the visual definition to draw attention to the element therein, including being caused to at least one of focus on a portion of the visual presentation including the element or apply a visual effect to the element, or focus on or apply a visual effect to one or more document components of the layout that depict the element.

18. The computer-readable storage medium of claim 15 having further readable program code portions stored therein that, in response to execution by the processor, cause the apparatus to further receive additional data for elements of the plurality of elements, wherein the apparatus being caused to integrate the data, visual presentation of the 3D model and layout of document components further includes the additional data, the additional data in the visual definition being navigable through interaction with the data, visual presentation or layout.

19. The computer-readable storage medium of claim 18 having further readable program code portions stored therein that, in response to execution by the processor, cause the apparatus to further navigate the additional data, including the apparatus being caused to at least:

receive selection of an element of the plurality of elements, the element being selectable from each of the list of the plurality of elements, visual presentation of the 3D model and layout of document components; and manipulate the additional data in the visual definition to draw attention to additional data for the element.

20. The computer-readable storage medium of claim 15 having further readable program code portions stored therein that, in response to execution by the processor, cause the apparatus to further at least:
  receive and process additional data for the physical instance of the complex system, the additional data being received and processed to identify a topical element from the plurality of elements, the elements depicted by the visual presentation of the 3D model including the topical element and one or more other elements of the plurality of elements; and
  apply a visual effect to the topical element depicted by the visual presentation to distinguish the topical element from the one or more other elements depicted by the visual presentation.

21. The computer-readable storage medium of claim 15 having further readable program code portions stored therein that, in response to execution by the processor, cause the apparatus to further at least:
  receive user-selection of a particular point on the visual presentation of the 3D model in the visual definition of the complex system; and
  translate the particular point to a particular location within a coordinate system of the complex system, and
  wherein the apparatus being caused to generate the layout of document components includes being caused to at least:
  identify a first document component that depicts an element of the complex system at the particular location or within a volume about or at least in part defined by the particular location, the first document component having and being identified from associated metadata that provides structured information reflecting a 3D geometry of the element within the coordinate system of the complex system; and
  generate the layout of document components including the first document component, and including one or more second document components identified from the associated metadata that provides structured information further identifying a link between the first document component and one or more second document components.

22. The apparatus of claim 6, wherein the additional data is also processed to calculate a level-of-interest value for the topical element, the topical element being one for which a number of issues has been identified, and the level-of-interest value being proportionate to the number of issues identified for the topical element, and
  wherein the apparatus being caused to apply the visual effect includes being caused to apply a color to the topical element, the color having a property that varies with the level-of-interest value that is proportionate to the number of issues identified for the topical element, and the one or more other elements being depicted by the visual presentation without any color applied thereto.

23. The method of claim 13, wherein the additional data is also processed to calculate a level-of-interest value for the topical element, the topical element being one for which a number of issues has been identified, and the level-of-interest value being proportionate to the number of issues identified for the topical element, and
  wherein applying the visual elect includes applying a color to the topical element, the color having a property that varies with the level-of-interest value that is proportionate to the number of issues identified for the topical element, and the one or more other elements being depicted by the visual presentation without any color applied thereto.

24. The computer-readable storage medium of claim 20, wherein the additional data is also processed to calculate a level-of-interest value for the topical element, the topical element being one for which a number of issues has been identified, and the level-of-interest value being proportionate to the number of issues identified for the topical element, and
  wherein the apparatus being, caused to apply the visual effect includes being caused to apply a color to the topical element, the color having a property that varies with the level-of-interest value that is proportionate to the number of issues identified for the topical element, and the one or more other elements being depicted by the visual presentation without any color applied thereto.

* * * * *